United States Patent
Yokota et al.

(10) Patent No.: US 6,788,604 B2
(45) Date of Patent: Sep. 7, 2004

(54) APPARATUS AND METHOD FOR DETERMINING THE ERASABILITY OF DATA IN A MEMORY

(75) Inventors: Teppei Yokota, Chiba (JP); Nobuyuki Kihara, Tokyo (JP)

(73) Assignee: Sony Corporation, Tokyo (JP)

( * ) Notice: Subject to any disclaimer, the term of this patent is extended or adjusted under 35 U.S.C. 154(b) by 497 days.

(21) Appl. No.: 09/734,411

(22) Filed: Dec. 11, 2000

(65) Prior Publication Data

US 2001/0021965 A1 Sep. 13, 2001

(30) Foreign Application Priority Data

Dec. 16, 1999 (JP) ............................................ 11-357110

(51) Int. Cl.⁷ .......................... G06F 9/312; G06F 12/16
(52) U.S. Cl. ........................ 365/218; 365/196; 711/166
(58) Field of Search ................................ 711/166, 156; 365/195, 196, 218; 713/1, 2

(56) References Cited

U.S. PATENT DOCUMENTS

| | | | | | |
|---|---|---|---|---|---|
| 4,939,713 A | * | 7/1990 | Satoh et al. | ............. | 369/44.11 |
| 5,226,157 A | * | 7/1993 | Nakano et al. | ............. | 711/162 |
| 5,273,294 A | * | 12/1993 | Amanai | ........................ | 463/24 |
| 5,388,083 A | * | 2/1995 | Assar et al. | ........... | 365/185.33 |
| 5,740,178 A | * | 4/1998 | Jacks et al. | .................. | 714/722 |
| 5,745,425 A | * | 4/1998 | Anderson et al. | ........... | 365/226 |
| 6,430,662 B1 | * | 8/2002 | Hurich et al. | ................ | 711/162 |
| 6,625,809 B1 | * | 9/2003 | Duff | ........................... | 717/169 |

FOREIGN PATENT DOCUMENTS

| | | | | |
|---|---|---|---|---|
| JP | 62120662 A | * | 6/1987 | |
| JP | 05046993 A | * | 2/1993 | |
| JP | 07105210 A | * | 4/1995 | |
| JP | 08255099 A | * | 10/1996 | |
| JP | 2002243458 A | * | 8/2002 | |
| WO | WO 9829844 A1 | * | 7/1998 | |

* cited by examiner

*Primary Examiner*—B. James Peikari
(74) *Attorney, Agent, or Firm*—Frommer Lawrence & Haug LLP; William S. Frommer; Samuel L. Lee

(57) ABSTRACT

A recording apparatus for facilitating data erasure operations involving data recorded on a recording medium. Each piece of data recorded on the recording medium may be examined to determine whether it is rerecordable by determining whether the data is already stored in another storage medium. When data erasure is requested, erasure processing may be controlled in accordance with the result of the determination. For example, original data based on data captured by a microphone or a camera (namely, non-rerecordable data) may not be erased (without specific approval by the user). Conversely, rerecordable data copied from another recording medium such as a CD may be erased.

23 Claims, 27 Drawing Sheets

FILE SYSTEM
PROCESSING HIERARCHY

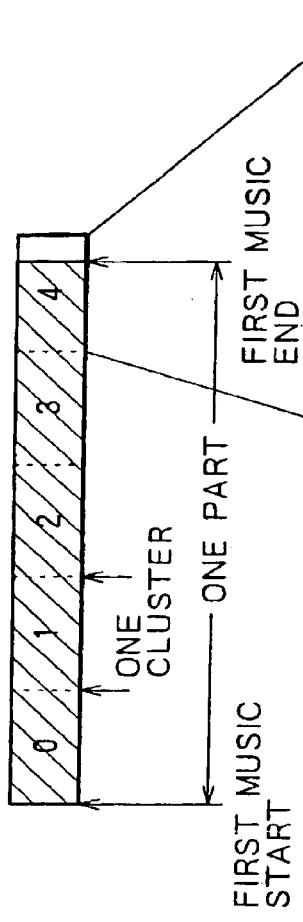
FIG. 9A
FIG. 9B
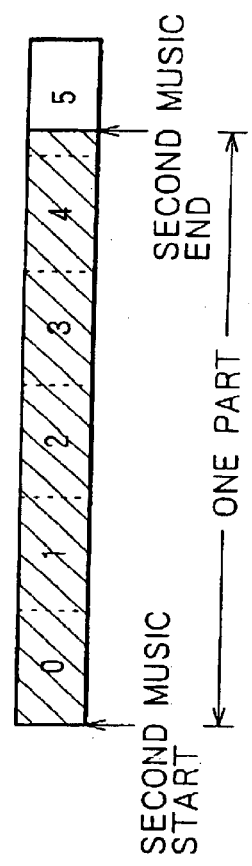
FIG. 9C

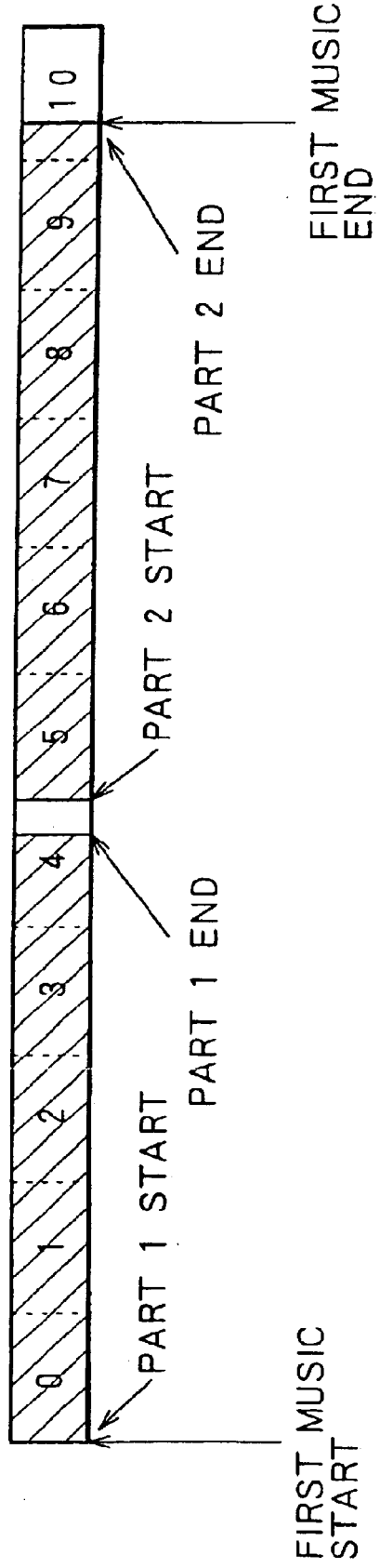

FIG. 11
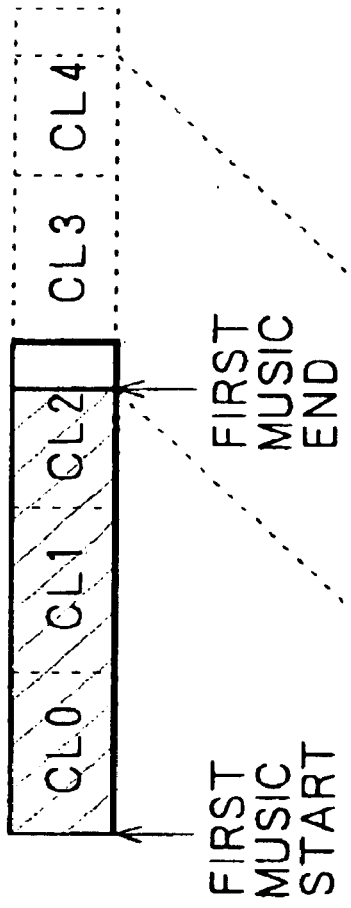
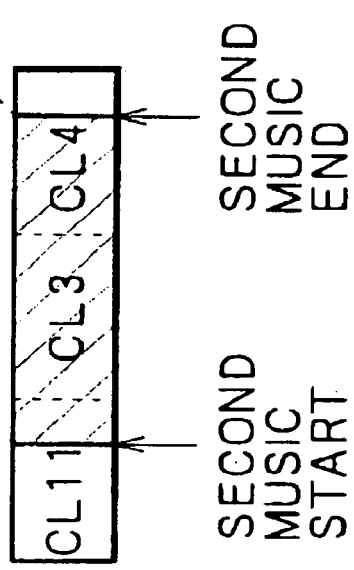

FIG. 12
REPRODUCTION MANAGEMENT FILE (PBLIST)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| HEADER 0x0000 | BLKID-TL0 | | | | Reserved | | MCode | | REVISION | | | Reserved | | | | |
| 0x0010 | SN1C+L | | SN2C-L | | SINFSIZE | | T-TRK | VerNo | | | | Reserved | | | | |
| 0x0020 | NM1-S (256) | | | | | | | | | | | | | | | |
| 0x0120 | NM2-S (512) | | | | | | | | | | | | | | | |
| 0x0320 | Reserved | | | | | | | | CONTENTS KEY | | | | | | | |
| 0x0330 | Reserved | | | | | | | | MAC | | | | | | | |
| | Reserved | | | | | | | | | | | S-YMDhms | | | | |
| TRKTBL 0x0350 | TRK-001 | TRK-002 | TRK-003 | TRK-004 | TRK-005 | TRK-006 | TRK-007 | TRK-008 | | | | | | | | |
| | TRK-009 | TRK-010 | TRK-011 | TRK-012 | TRK-013 | TRK-014 | TRK-015 | TRK-016 | | | | | | | | |
| | ... | | | | | | | | | | | | | | | |
| 0x0660 | TRK-393 | TRK-394 | TRK-395 | TRK-396 | TRK-397 | TRK-398 | TRK-399 | TRK-400 | | | | | | | | |
| 0x0647 | INF-S (14720) | | | | | | | | | | | | | | | |
| 0x3FF0 | BLKID-TL0 | | | | Reserved | | MCode | | REVISION | | | Reserved | | | | |

FIG. 13

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| INF | ID | 0x00 | 0x00 | SIZE | | MCode | | C+L | | Reserved | | DATA VARIABLE LENGTH | | | |

ADDITIONAL INFORMATION DATA (INF-S)

FIG. 14

ADDITIONAL INFORMATION KEY CODES

| ID | MUSIC (CHARACTER) |  | ID | URL (WEB) |  |
|---|---|---|---|---|---|
| 0 | RESERVED |  | 32 | RESERVED |  |
| 1 | ALBUM | VARIABLE | 33 | ALBUM | VARIABLE |
| 2 | SUBTITLE | VARIABLE | 34 | SUBTITLE | VARIABLE |
| 3 | ARTIST | VARIABLE | 35 | ARTIST | VARIABLE |
| 4 | CONDUCTOR | VARIABLE | 36 | CONDUCTOR | VARIABLE |
| 5 | ORCHESTRA | VARIABLE | 37 | ORCHESTRA | VARIABLE |
| 6 | PRODUCER | VARIABLE | 38 | PRODUCER | VARIABLE |
| 7 | PUBLICATION/PUBLISHER | VARIABLE | 39 | PUBLICATION/PUBLISHER | VARIABLE |
| 8 | COMPOSER | VARIABLE | 40 | COMPOSER | VARIABLE |
| 9 | SONG WRITER | VARIABLE | 41 | SONG WRITER | VARIABLE |
| 10 | ADAPTER | VARIABLE | 42 | ADAPTER | VARIABLE |
| 11 | SPONSOR | VARIABLE | 43 | SPONSOR | VARIABLE |
| 12 | CM | VARIABLE | 44 | CM | VARIABLE |
| 13 | DESCRIPTION | VARIABLE | 45 | DESCRIPTION | VARIABLE |
| 14 | ORIGINAL TITLE NAME | VARIABLE | 46 | ORIGINAL TITLE NAME | VARIABLE |
| 15 | ORIGINAL ALBUM NAME | VARIABLE | 47 | ORIGINAL ALBUM NAME | VARIABLE |
| 16 | ORIGINAL COMPOSER | VARIABLE | 48 | ORIGINAL COMPOSER | VARIABLE |
| 17 | ORIGINAL SONG WRITER | VARIABLE | 49 | ORIGINAL SONG WRITER | VARIABLE |
| 18 | ORIGINAL ADAPTER | VARIABLE | 50 | ORIGINAL ADAPTER | VARIABLE |
| 19 | ORIGINAL PLAYER | VARIABLE | 51 | ORIGINAL PLAYER | VARIABLE |
| 20 | MESSAGE | VARIABLE | 52 |  |  |
| 21 | COMMENT | VARIABLE | 53 |  |  |
| 22 | WARNING | VARIABLE | 54 |  |  |
| 23 | GENRE | VARIABLE | 55 |  |  |
| 24 | TEXT | VARIABLE | 56 |  |  |
| 25 |  |  | 57 |  |  |
| 26 |  |  | 58 |  |  |
| 27 |  |  | 59 |  |  |
| 28 |  |  | 60 |  |  |
| 29 |  |  | 61 |  |  |
| 30 |  |  | 62 |  |  |
| 31 |  |  | 63 |  |  |

FIG. 15

ADDITIONAL INFORMATION KEY CODES

| ID | PATH/OTHERS | | ID | CONTROL/NUMERIC DATA | |
|---|---|---|---|---|---|
| 64 | RESERVED | | 96 | RESERVED | |
| 65 | PATH TO IMAGE DATA | VARIABLE | 97 | ISRC | 8 |
| 66 | PATH TO LYRICS DATA | VARIABLE | 98 | TOC-ID | 8 |
| 67 | PATH TO MIDI DATA | VARIABLE | 99 | UPC/JAN | 7 |
| 68 | PATH TO DESCRIPTION DATA | VARIABLE | 100 | RECORDING DATE (YMDhms) | 4 |
| 69 | PATH TO COMMENT DATA | VARIABLE | 101 | RELEASE DATE (YMDhms) | 4 |
| 70 | PATH TO CM DATA | VARIABLE | 102 | ORIGINAL RELEASE DATE (YMDhms) | 4 |
| 71 | PATH TO FAX DATA | VARIABLE | 103 | RECORDING DATE (YMDhms) | 4 |
| 72 | PATH TO COMMUNICATION DATA 1 | VARIABLE | 104 | SUB TRACK | 4 |
| 73 | PATH TO COMMUNICATION DATA 2 | VARIABLE | 105 | AVERAGE VOLUME | 1 |
| 74 | PATH TO CONTROL DATA | VARIABLE | 106 | RESUME | 4 |
| 75 | | | 107 | REPRODUCTION LOG (YMDhms) | 4 |
| 76 | | | 108 | REPRODUCTION COUNT (FOR LEARNING) | 1 |
| 77 | | | 109 | PASSWORD 1 | 16 |
| 78 | | | 110 | APP LEVEL | 16 |
| 79 | | | 111 | GENRE CODE | 2 |
| 80 | | | 112 | MIDI DATA | VARIABLE |
| 81 | PART ADDITIONAL INFORMATION | VARIABLE | 113 | THUMBNAIL PHOTO DATA | VARIABLE |
| 82 | | | 114 | CHARACTER BROADCAST DATA | VARIABLE |
| 83 | | | 115 | TOTAL NUMBER OF MUSIC | 2 |
| 84 | | | 116 | SET NUMBER | 1 |
| 85 | | | 117 | TOTAL NUMBER OF SET NUMBERS | 1 |
| 86 | | | 118 | REC POSITION INFORMATION-GPS | VARIABLE |
| 87 | | | 119 | PB POSITION INFORMATION-GPS | VARIABLE |
| 88 | | | 120 | REC POSITION INFORMATION-PHS | VARIABLE |
| 89 | | | 121 | PB POSITION INFORMATION-PHS | VARIABLE |
| 90 | DISC-TOC | VARIABLE | 122 | DESTINATION TELEPHONE NUMBER 1 | VARIABLE |
| 91 | | | 123 | DESTINATION TELEPHONE NUMBER 2 | VARIABLE |
| 92 | | | 124 | INPUT VALUE | VARIABLE |
| 93 | | | 125 | OUTPUT VALUE | VARIABLE |
| 94 | | | 126 | PB CONTROL DATA | VARIABLE |
| 95 | | | 127 | REC CONTROL DATA | VARIABLE |

FIG. 16

ADDITIONAL INFORMATION KEY CODES

| ID | SYNC REPRODUCTION | |
|---|---|---|
| 128 | RESERVED | |
| 129 | SYNC REPRODUCTION 1 | VARIABLE |
| 130 | SYNC REPRODUCTION 2 | VARIABLE |
| 131 | SYNC REPRODUCTION 3 | VARIABLE |
| 132 | SYNC REPRODUCTION 4 | VARIABLE |
| 133 | SYNC REPRODUCTION 5 | VARIABLE |
| 134 | SYNC REPRODUCTION 6 | VARIABLE |
| 135 | | |
| 136 | | |
| 137 | | |
| 138 | EMD 1 | VARIABLE |
| 139 | EMD 2 | VARIABLE |
| 140 | | |
| 141 | | |
| 142 | | |
| 143 | | |
| 144 | | |
| 145 | | |
| 146 | | |
| 147 | | |
| 148 | | |
| 149 | | |
| 150 | | |
| 151 | | |
| 152 | | |
| 153 | | |
| 154 | | |
| 155 | | |
| 156 | | |
| 157 | | |
| 158 | | |
| 159 | | |

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| INF | 0x00 | ID | 0x00 | SIZE | | MCode | | C+L | | Reserved | | VARIABLE DATA | | | |

| ID | | ARTIST | | SIZE | | ASCII | ENGLISH | | | | DATA | | | |
|---|---|---|---|---|---|---|---|---|---|---|---|---|---|---|
| 0x69 | 0x00 | 3 | 0x00 | 0x1C(28) | | MCode | 0x01 | 0x09 | 0x00 | 0x00 | S | I | M | O |
| N | & | A | B | C | D | E | F | G | H | I | 0x00 | | | |

|  |  |  |  |  |  | ID | | ISRC | |
|---|---|---|---|---|---|---|---|---|---|
| SIZE | | BINARY | NO | SETTING | | 0x69 | 0x00 | 97 | 0x00 |
| 0x14(20) | MCode | 0x00 | 0x00 | 0x00 | 0x00 | ISRC Code 8Bytes | | | |
| | | | | | | DATA | | | |

| ID | | RECORDING DATE | | SIZE | | BINARY | NO | SETTING | | DATA |
|---|---|---|---|---|---|---|---|---|---|---|
| 0x69 | 0x00 | 103 | 0x00 | 0x10(16) | | MCode | 0x00 | 0x00 | 0x00 | 0x00 | YMD hms |

745   565

| Y | M | D | h | m | s |
|---|---|---|---|---|---|

31,30,29                3,2,1,0bit

| ID | | REPRO-DUCTION LOG | | SIZE | | BINARY | NO | SETTING | | DATA |
|---|---|---|---|---|---|---|---|---|---|---|
| 0x69 | 0x00 | 103 | 0x00 | 0x10(15) | | MCode | 0x00 | 0x00 | 0x00 | 0x00 | YMD hms |

745   565

| Y | M | D | h | m | s |
|---|---|---|---|---|---|

31,30,29                3,2,1,0bit

FIG. 18

A3Dnnnn. MSA (ATRAC3 DATA FILE)

| Offset | 0 | 1 | 2 | 3 | 4 | 5 | 6 | 7 | 8 | 9 | A | B | C | D | E | F | |
|---|---|---|---|---|---|---|---|---|---|---|---|---|---|---|---|---|---|
| 0x0000 | BLKID-HD0 | | | | Reserved | | MCode | | Reserved | | | | BLOCK SERIAL | | | | HEADER |
| 0x0010 | N1C+L | | N2C+L | | INFSIZE | | T-PRT | | T-SU | | | | INX | | XT | | |
| 0x0020 | NM1 (256) | | | | | | | | | | | | | | | | |
| 0x0120 | NM2 (512) | | | | | | | | | | | | | | | | |
| 0x0310 | | | | | | | | | | | | | | | | | |
| 0x0320 | Reserved (8) | | | | | | | | CONTENTS KEY | | | | | | | | BLOCK (ATTRIBUTE HEADER) |
|  | Reserved (8) | | | | | | | | C-MAC [n] | | | | | | | | |
|  | Reserved (12) | | | | | | | | | | | | A | LT | FNo | | TRK INF |
|  | MG (D) SERIAL-nnn | | | | | | | | | | | | | | | | |
| 0x0360 | CONNUM | | | | YMDhms-S | | | | YMDhms-E | | | | MT | CT | CC | CN | |
| 0x0370 | PRTSIZE | | | | PRTKEY | | | | | | | | Reserved (8) | | | | |
| 0x0380 | | | | | CONNUMO | | | | PRTSIZE (0x0388) | | | | PRTKEY | | | | PRT INF |
| 0x0390 | | | | | Reserved (8) | | | | | | | | CONNUMO | | | | |
|  | INF (0x0400) | | | | | | | | | | | | | | | | |
| 0x3FFF | BLKID-HD0 | | | | Reserved | | MCode | | Reserved | | | | BLOCK SERIAL | | | | |
| 0x4000 | BLKID-A3D | | | | Reserved | | MCode | | CONNUMO | | | | BLOCK SERIAL | | | | HEADER |
| 0x4010 | BLOCK SEED | | | | | | | | INITIALIZATION VECTOR | | | | | | | | |
| 0x4020 | SU-000 (Nbytes=384bytes) | | | | | | | | | | | | | | | | |
| 0x41A0 | SU-001 (Nbytes) | | | | | | | | | | | | | | | | |
| 0x4320 | SU-002 (Nbytes) | | | | | | | | | | | | | | | | BLOCK |
| 0x04A0 | SU-041 (Nbytes) | | | | | | | | | | | | | | | | |
| 0x7DA0 | | | | | | | | | | | | | | | | | |
| 0x7F20 | Reserved (Nbytes=208bytes) | | | | | | | | | | | | | | | | |
|  | BLOCK SEED | | | | | | | | | | | | | | | | |
| 0x7FF0 | BLKID-A3D | | | | Reserved | | MCode | | CONNUMO | | | | BLOCK SERIAL | | | | |

F I G. 19

| BIT | MEANING | VALUE | |
|---|---|---|---|
| 7 | ATRAC3 MODE | 0:DUAL | 1:JOINT |
| 6 | RATE VALUE | N DISPLAY TIME RATE SU BYTE<br>7 HQ 47min 176kbps 31SU 512<br>6 EX 58min 146kbps 38SU 424<br>5 EX 64min 132kbps 42SU 384<br>4 SP 81min 105kbps 53SU 304<br>3 LP 90min 94kbps 59SU 272<br>2 LP 128min 66kbps 84SU 192<br>1 MN 181min 47kbps 119SU 136<br>0 MN 258min 33kbps 169SU 96<br>(N IS VALUE OF 3 BITS 6, 5, AND 4)<br>* N=0, 1 MONAURAL SPECIFIES SPECIAL JOINT MODE OF ONLY MAIN SIGNAL WITH BIT 7 BEING "1" (JOINT). | |
| 5 | | | |
| 4 | | | |
| 3 | RESERVED | — | |
| 2 | DATA DIVISION | 0:AUDIO | 1:OTHER |
| 1 | REPRODUCTION SKIP | 0:NORMAL REPRODUCTION | 1:SKIP |
| 0 | EMPHASIS | 0:OFF | 1:ON (50/15μs) |

| BIT | MEANING | | VALUE |
|---|---|---|---|
| 7 | COPY CONTROL | COPY PROTECTED /ENABLED | 0: PROTECTED    1: ENABLED |
| 6 | | GENERATION | 0: ORIGINAL    1: 1ST OR HIGHER GENERATION |
| 5 | HIGH-SPEED DIGITAL COPY CONTROL (HCMS) | | 00: COPY PROTECTED    01: 1ST GENERATION |
| 4 | | | 10: COPY ENABLED |
| 3 | COPY ATTRIBUTE | | 000: RESERVED |
| 2 | | | 001: CONTENT RECORDED FROM ORIGINAL SOURCE |
| | | | 010: CONTENT COPIED FROM LCM |
| 1 | | | 011: CONTENT MOVED FROM LCM |
| | | | 100 OR HIGHER: RESERVED |
| 0 | RESERVED | | — |

CC

LCM: LICENSED COMPLIANT MODULE
EXAMPLE: HDD, ETC. OF PC AND CONSUMER EQUIPMENT

FIG. 26

```
ROOT
  ├─ DCIM        ··· STILL PICTURE DIRECTORY
  ├─ MOxxxxnn    ··· MOVING PICTURE DIRECTORY
  ├─ VOICE       ··· VOICE DIRECTORY
  ├─ AVCTL       ··· CONTROL DIRECTORY
  ├─ HIFI        ··· MUSIC DIRECTORY
  └─ HIFIEL      ··· ERASE CONTENT ID FILE
```

FIG. 27

```
ROOT
  ├─ DCIM        ··· STILL PICTURE DIRECTORY
  ├─ MOxxxxnn    ··· MOVING PICTURE DIRECTORY
  ├─ VOICE       ··· VOICE DIRECTORY
  ├─ AVCTL       ··· CONTROL DIRECTORY
  └─ HIFI        ··· MUSIC DIRECTORY
       └─ HIFIEL ··· ERASE CONTENT ID FILE
```

APPARATUS AND METHOD FOR DETERMINING THE ERASABILITY OF DATA IN A MEMORY

BACKGROUND

The present invention relates to a processing or recording technique for use with recording media for recording data such as audio data and video data.

In an electrically erasable non-volatile memory—referred to as an EEPROM (Electrically Erasable Programmable ROM)—two transistors are used to store one bit of data. This two transistor configuration means that EEPROM circuits require a relatively large integrated circuit surface area, and limits the integration density of the circuits.

To solve this memory density limitation problem, a flash memory has been developed in which one bit is stored using only one transistor, and all bits can be erased simultaneously. Thus, the flash memory is expected to replace recording media, such as magnetic discs and optical discs.

A removable flash memory card has been developed for use with various electronic devices. This memory card can be used in digital audio data recording/reproducing apparatuses instead of, or in addition to, conventional disc media such as CD (Compact Disc) and MD (Mini Disc).

Various pieces or types of data, in addition to audio or video data, may be recorded together on one recording medium such as a flash memory card by a recording apparatus. For example, a recording apparatus may record, as a single data group, music data reproduced from a CD or MD, or distributed by a communication or broadcast means. As another example, the recording apparatus may record voice data captured through a microphone as another data group. Such voice data recording ability may be useful for taking audio memos, recording a conference, and the like. Furthermore, the recording apparatus may record, as a single data group, still picture data and moving picture data captured by still cameras and video cameras. Moreover, the recording apparatus may record data to be used by a personal computer.

Thus, various types of data may be recorded on one memory card. Accordingly, when the memory card is full or contains different types of data, it may be difficult for a user to determine which data is to be erased. In such a situation, when the user wishes to erase certain data, the user needs to check the data to be erased. However, such an arrangement may be very inefficient.

SUMMARY

It is an object of the present invention to provide a recording or processing apparatus capable of executing operations so as to enable a user to erase data in a relatively easy and efficient manner.

According to an aspect of the present invention, an apparatus for processing data is provided. The apparatus comprises a determining device for determining whether data stored in a first storage medium is re-recordable by determining whether the data is already stored in a second storage medium. The apparatus also comprises a controller for controlling an erase process for the stored data according to a result of the re-recordability result made by the determining means.

Upon receiving a request to erase a particular piece of data, the abovementioned control device may execute erase processing for the particular piece of data if such piece of data is found by the discriminating device as being restorable or re-recordable and may execute erase disable processing if such particular piece of data is found by the discriminating device as not being restorable or re-recordable. If a particular piece of data is disabled for erase, the control device may execute notification processing so as to provide notification that the particular data is disabled for erase and, if a command for erasing the particular piece of data is received after the notification processing, may execute erase processing for the particular piece of data. Further, upon receiving a request to erase an unspecified piece of data, the control device may execute erase processing for data found by the discrimination device as being restorable or re-recordable and may not execute erase processing for data found by the discrimination device as being not restorable or re-recordable.

If storage capacity of the above-mentioned storage or recording medium becomes low in recording data, the control device may execute erase processing for data found by the discrimination device as being restorable or re-recordable.

Non-rerecordable type of data may be audio data captured by a microphone or video data captured by a camera. Additionally, non-rerecordable type of data may be based on data copied from another recording medium to the respective recording medium.

The recording medium may be a non-volatile memory or a disc-shaped recording medium.

Management information for managing rerecordable and non-rerecordable type of data may be recorded on the recording medium.

An identifier which identifies the recording medium from which re-recordable type data has been obtained may be recorded on the respective recording medium as additional information. The additional information may be an international standard recording code (ISRC). The additional information may be an identifier generated on the basis of management information of the recording medium from which the data has been recorded. Further, when executing the erase processing for re-recordable type data, the control device may execute processing so as to leave the additional information on the recording medium.

According to the present invention, non-rerecordable type data, which may be original data created from data captured by a microphone or a camera, may be protected against erasure. On the other hand, rerecordable type data, which may be copied from another disc, may be erased preferentially. This enables a user to erase desired data more easily and may eliminate cumbersome and/or time consuming operations. Additionally, when rerecordable type data is erased, the additional information of that data may not be erased and may be left on the recording medium, thereby facilitating the subsequent rerecording processing for that data.

Therefore, summarizing the above description, the term "re-recordable" data, in this Specification, refers to data that is stored in a first recording medium but can be marked to be erased because that data can be restored or recorded again into the first recording medium from a copy of that data stored in a second recording medium.

The above and other objects, features and advantages according to the present invention will be apparent from the following detailed description of the illustrated embodiments when read in conjunction with the accompanying drawings in which corresponding components are identified by the same reference numerals.

BRIEF DESCRIPTION OF THE DRAWINGS

FIGS. 9A–C are diagrams showing configurations of data files used in one embodiment of the invention;

FIG. 10 is a diagram showing a combine edit process using the data files shown in FIGS. 9A–C;

FIG. 11 is a diagram showing a divide edit process using the data files shown in FIGS. 9A–C;

FIG. 12 is a diagram showing the detailed configuration of the reproduction management file shown in FIG. 7;

FIG. 13 is a diagram showing the detailed configuration of the additional information area INF-S of the reproduction management file shown in FIG. 12;

FIG. 14 is a table showing additional information key codes used in the additional information area;

FIG. 15 is a table showing further additional information key codes used in the additional information area;

FIG. 16 is a table showing further additional information key codes used in the additional information area;

FIG. 18 is a diagram showing the detailed configuration of a data file for one embodiment of the invention;

FIG. 19 is a diagram showing the details of location "A" in the attribute header of the data file shown in FIG. 18;

FIG. 20 is a diagram showing the details of location "CC" in the attribute header of the data file shown in FIG. 18;

FIG. 26 is a diagram of an erase data ID file;

FIG. 27 is a diagram of another erase data ID file;

DETAILED DESCRIPTION

Figure 1:
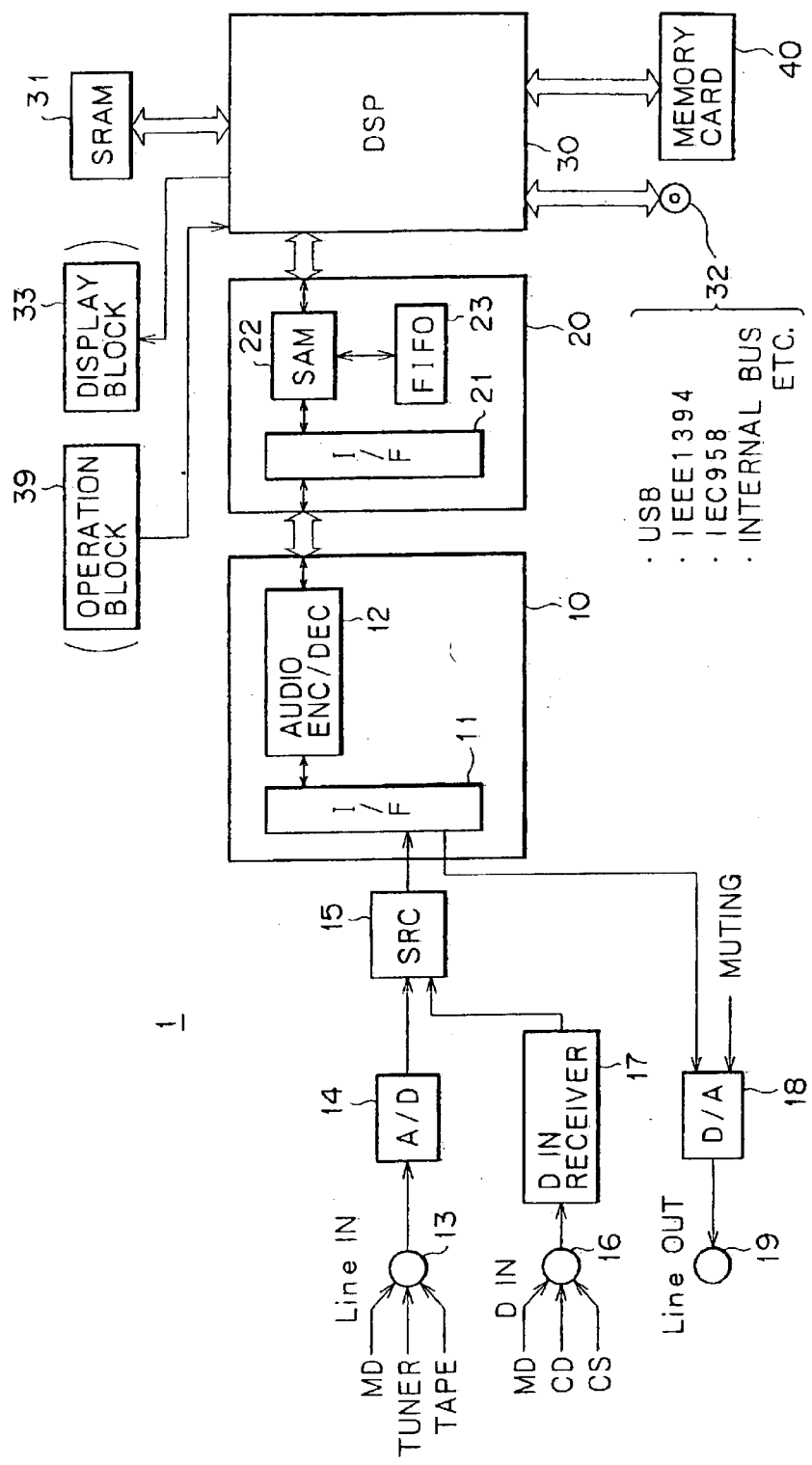
FIG. 1 is a block diagram showing a recorder practiced as one embodiment of the invention.

This present invention will now be described with reference to the accompanying drawings. The following embodiments may use a memory card based on non-volatile memory (or flash memory) as a recording medium. A recording apparatus capable of recording/reproducing data may use such memory card. Data which may be handled in the following embodiments include audio data (such as music data), voice data (such as dictation voice), video data (such as moving picture data and/or still picture data), text data, program data, and so forth. In the following description, rerecordable type data may be audio data (such as music data) and non-rerecordable type data may be voice data (such as dictation voice data captured by a microphone). However, the present invention is not limited to such types of rerecordable and non-rerecordable data and, alternatively, other kinds of data may utilized. The embodiments will be described in the following order:

1. Configuration of the Recorder
2. Configuration of the Memory Card
3. File System
   3-1. Processing structure and data structure
   3-2. Directory structure
   3-3. Management structure and editing scheme
   3-4. Reproduction management file
   3-5. Data files
4. Configuration of a Device having a HDD
5. Various Recording Paths to the Memory Card and Identification Information of Data Supply Source
6. Data Erase Processing
7. All Erase Processing
8. Data Erase Processing for Recording 1. Configuration of the Recorder FIG. 1 shows the configuration of a memory card recording/reproducing apparatus (hereinafter referred to as recorder 1) capable of recording and reproducing data, such as audio data, on a memory card. Recorder 1 uses a detachable memory card as its recording medium. Recorder 1 may be configured as a stand-alone audio device or incorporated into a personal computer or an audio/visual device. As a stand-alone device, the recorder could be a full-size rack component or a portable unit. Further, the recorder may be integrated into an audio system along with other components such as an amplifier, a speaker, a CD player, a MD recorder, a tuner, etc. When integrated the recorder may be configured as a memory card drive occupying a position similar to CD-ROM drives and floppy disc drives in personal computers. The recorder may also be incorporated into a video camera or game machine using the memory card as a recording medium for video data and audio data. Regardless of the configuration, the recorder can be used for recording digital audio signals distributed through satellite-based systems, digital broadcasting, or the Internet. FIG. 1 shows a generic configuration of recorder 1 as a memory card recording/reproducing apparatus that can be realized in any of the above-mentioned applications.

Recorder 1 has an audio encoder/decoder IC 10, a security IC 20, and a DSP (Digital Signal Processor) 30, each implemented using a single IC chip. A memory card 40 is detachably mounted on the recorder. The memory card is formed by a flash memory (a nonvolatile memory), a memory control block, and a security block including a DES (Data Encryption Standard) encryption circuit, all implemented in one IC chip. From the foregoing discussion, it will be apparent that a microcomputer or equivalent may be used instead of DSP 30.

The audio encoder/decoder IC has an audio interface 11 and an encoder/decoder block 12. The encoder/decoder block efficiently encodes a digital signal so that it is written to memory card 40 and decodes data read from memory. For high efficiency encoding improved ATRAC (Adaptive Transform Acoustic Coding referred to as ATRAC3), as used for the Mini Disc, is used. In ATRAC3, 16 bit wide audio data sampled at 44.1 KHz is processed. The minimum audio data unit processed by ATRAC3 is a sound unit SU. A SU is 1,024 samples of data (1,024×16 bits×2 channels) compressed into several hundred bytes, covering about 23 ms of playing time. Audio data is compressed by ATRAC3 into about 1/10 of the original data size. The signal processing of ATRAC3 minimizes the deterioration of tone quality due to refinements in the compression and decompression processing.

A line input selector 13 selectively supplies MD reproduction output, a tuner output, or a tape reproduction output to an A/D converter 14. The A/D converter 14 converts a selected line input signal into a digital audio signal (sampling frequency=44.1 KHz, 1 sample=16 bits).

A digital input selector 16 selectively supplies MD, CD, or CS (satellite digital broadcast) to a digital input receiver 17. Digital inputs are typically transmitted through an optical cable. The output of the digital input receiver is supplied to a sampling rate converter 15, in which the sampling frequency of the digital input is converted to 44.1 KHz.

The encoded data obtained by the encoding in encoder/decoder block 12 of the audio encoder/decoder IC 10 is supplied to DES encryption circuit 22 through interface 21 of security IC 20. The DES encryption circuit has a FIFO 23. The DES encryption circuit is provided to protect copyrights of the data. Memory card 40 also incorporates a DES encryption circuit, which will be described later. DES encryption circuit 22 of recorder 1 has two or more master keys and a device-unique storage key. In addition, the DES encryption circuit has a random number generator to share authentication and session keys with the memory card. The DES encryption circuit can turn a key on by using the storage key.

The encrypted audio data from the DES encryption circuit is supplied to DSP (Digital Signal Processor) 30. DSP 30 communicates with memory card 40 through an attached adapting mechanism (not shown), and writes the encrypted data to the flash memory. Serial communication is carried out between the DSP and the memory card. In order to allocate a memory size large enough to control the memory card, an external SRAM (Static Random Access Memory) 31 is connected to the DSP.

The DSP is also connected to a terminal 32 through which data and control data are transferred with external devices or external circuit blocks (not shown). The DSP communicates with external devices through interface 37, shown in FIG. 2. Interface 37 and terminal 32 are compliant with any of the numerous communication standards; such as USB, IEEE 1394, IEC 958, serial port, and parallel port. This allows the recorder to communicate with personal computers and audio/visual equipment. If recorder 1 is incorporated in a personal computer or an audio/visual device, interface 37 and terminal 32 are configured as an internal bus connected to the system controller in the personal computer or the audio/visual device.

From the device or block connected to terminal 32, various data is supplied to DSP 30. For example, if the recorder is part of an audio system or a computer system, an external system controller for controlling the entire operation of the audio system or the computer system provides record and playback commands generated according to user operations. Additional information data, such as image information and text information, are also supplied to the DSP through the terminal.

In addition, DSP 30 can supply additional information data and control signals read from memory card 40 to the system controller.

FIG. 1 also shows an operation block 39 having various controls with which a user carries out desired operations and a display block 33 on which various pieces o f information are displayed to the user. These block s are required when the recorder is configured as a stand-alone unit. If the recorder is incorporated in a personal computer, operation block 39 and display block 33 need not be directly connected to the DSP. Namely, in the stand-alone configuration, the DSP processes inputs from the operation block and controls the display block. In the incorporated configuration, the system controller of the host device executes these control operations, supplying operational information to the DSP and receiving information indicative of the data to be displayed from the DSP, as required.

The encrypted audio data, as data read by DSP 30 from memory card 40, is decrypted by security IC 20 and the decrypted audio data is then ATRAC3-decoded by audio encoder/decoder IC 10. The decoded output of the audio encoder/decoder IC is supplied to D/A converter 18 to be converted into an analog audio signal. The analog audio signal is output to a line output terminal 19. The line output is transmitted to an amplifier (not shown), to be reproduced through a speaker or headphone.

It should be noted that a muting signal can be supplied from an external controller to the D/A converter. If the muting signal indicates that muting is on, the audio output from line output terminal 19 is suppressed. FIG. 1 shows line output terminal 19. It will be apparent that a digital output terminal, a headphone terminal, etc. may also be used. The data may also be output to an external device through terminal 32, as described above.

Figure 2:
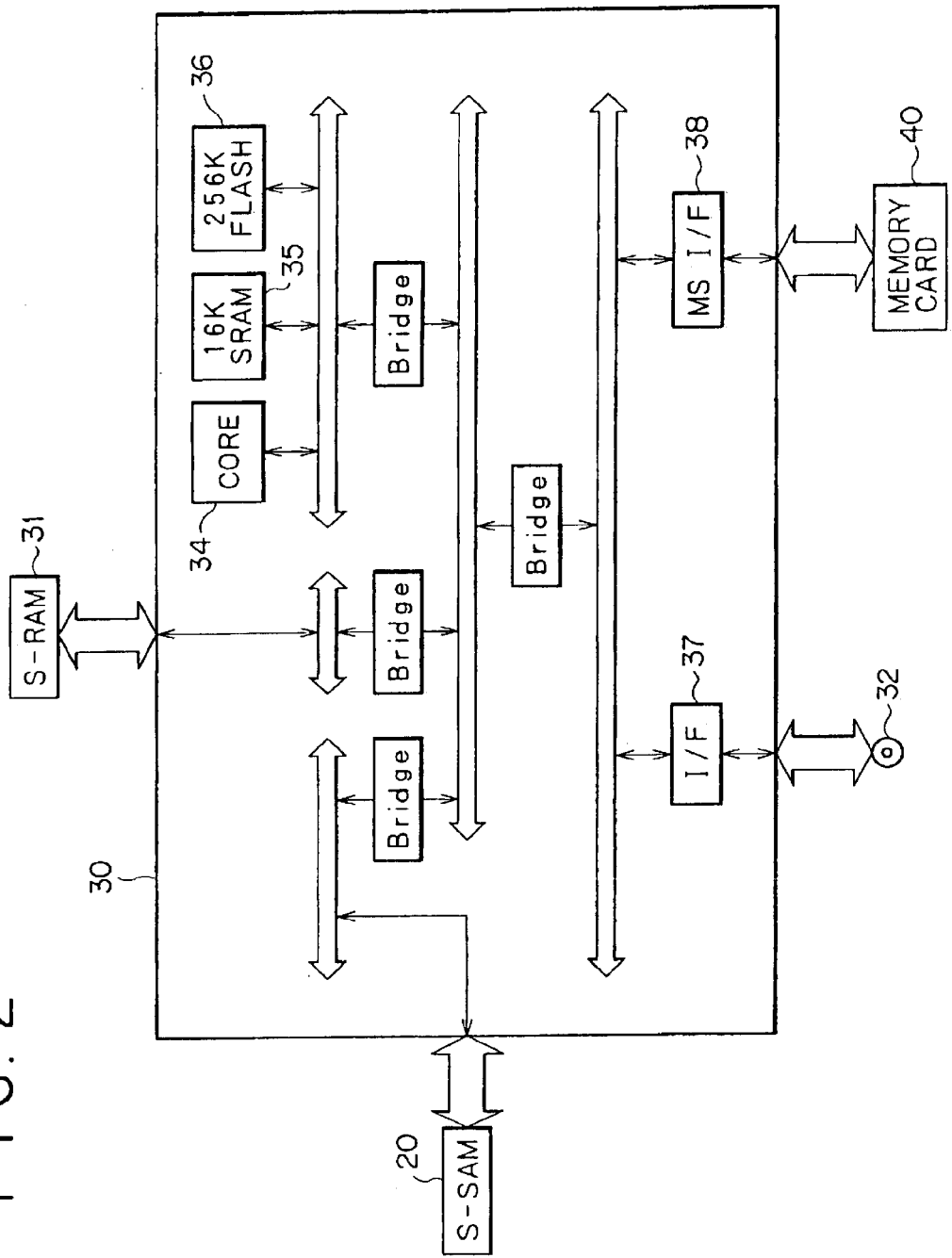
FIG. 2 is a block diagram showing the DSP of the recorder shown in the embodiment of FIG. 1.

FIG. 2 shows an internal configuration of DSP 30. DSP 30 is made up of a core 34, a flash memory 35, an SRAM 36, an interface 37, a memory card interface 38, buses, and inter-bus bridges. The DSP finctions like a microcomputer, core 34 being equivalent to a CPU. The flash memory stores programs necessary for DSP processing. SRAM 36 and SRAM 31 are used as working memories necessary for various processing operations.

DSP 30 responds to an operation signal, such as a record command received through interface 37 or input from operation block 39, to write predetermined encrypted audio data and predetermined additional information data to memory card 40 and control processing of this data. More specifically, DSP 30 interprets application software for recording/reproducing audio data to control the memory card.

File management on the memory card is performed using the FAT file system, generally used on personal computers. In addition to this file system, the present embodiment also uses a reproduction management file. The reproduction management file manages the data files recorded on the memory card. The reproduction management file acts as a first file manager handling all audio data files. The FAT acts as a second file manager handling all files stored in the flash memory, including audio data files and the reproduction management file. The reproduction management file is recorded on the memory card. The FAT is written on the flash memory before shipment from the factory, along with a root directory.

In order to protect copyrights, the present embodiment encrypts the ATRAC3compressed audio data. However, the management files are not encrypted because they are not considered to be copyrighted. Moreover, only some versions of memory card 40 have encryption capabilities. Recorders that record copyrighted audio data can only use those memory cards having encryption capabilities, as in the present embodiment.

2. Configuration of the Memory Card

Figure 3:
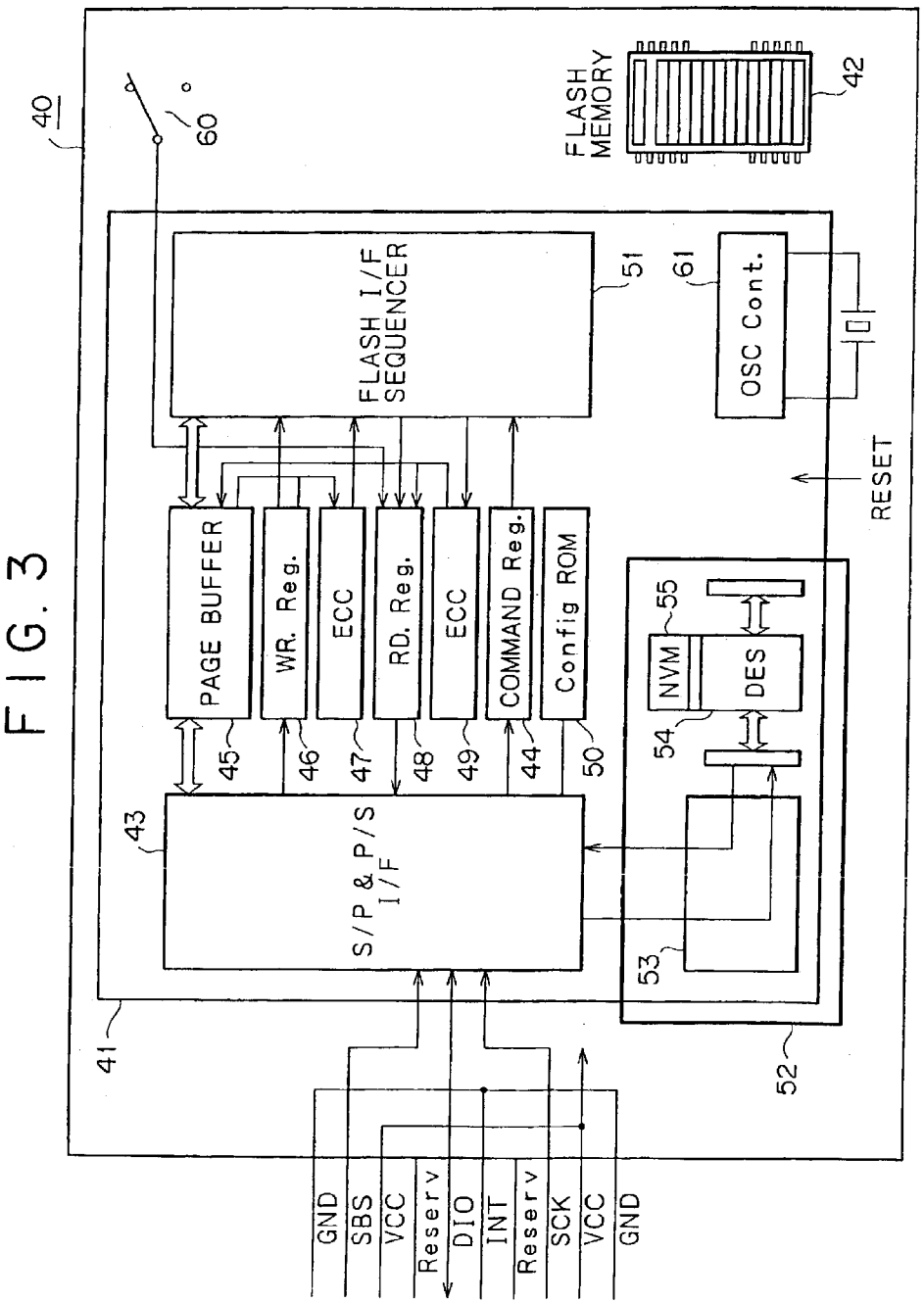
FIG. 3 is a block diagram showing the configuration of the memory card shown in the embodiment of FIG. 1.

FIG. 3 shows the configuration of memory card 40. The memory card is made up of control block 41 and flash memory 42 on one IC chip.

The two-way serial interface between DSP 30 and the memory card is composed of 10 lines. The four main lines are a clock line SCK for transmitting a clock signal, a status line SBS, data line DIO for transmitting data, and interrupt line INT. In addition, two ground lines GND and two supply lines VCC are arranged to supply power. Two reserved lines are undefined.

The clock line SCK transmits a clock signal synchronized with the data. The status line SBS transmits a signal indicative of the status of the memory card. The data line DIO inputs and outputs commands and encrypted audio data. The interrupt line INT transmits an interrupt signal to DSP 30 in response to an interrupt request by the memory card. An interrupt signal is also generated when the memory card is loaded in the recorder. However, in the present embodiment the interrupt line INT is grounded so the interrupt signal is transmitted over data line DIO.

A serial/parallel conversion and parallel/serial conversion interface block (S/P & P/S IF block) 43 acts as an interface between the DSP and the control block 41, that are interconnected through the above-mentioned lines. The S/P & P/S IF block converts serial data received from the DSP into parallel data and supplies it to the control block. It also converts parallel data from the control block into serial data and supplies it to the DSP. In addition, the S/P & P/S IF block receives commands and data through data line DIO and separates the received commands and data into those for normal access and those for encryption.

More specifically, in the format used by the data line, commands are transmitted first, followed by the data. The S/P & P/S IF block checks the command code to determine whether the transmitted command and data are for normal access or for encryption. According to this code, the normal access command is held in command register 44 and normal access data is held in page buffer 45 and write register 46. An error correction encoding circuit 47 is associated with the write register. For data temporarily stored in the page buffer, the error correction encoding circuit generates an error correction code.

The data output from the command register, the page buffer, the write register, and the error correction encoding circuit are supplied to a flash memory interface and sequencer (a memory IF sequencer) 51. The memory IF sequencer acts as a data transfer interface between the control block and the flash memory. Through the memory IF sequencer, data is written to the flash memory.

For copyright protection purposes, data (the audio data compressed by ATRAC3, hereafter being referred to as ATRAC3 data) to be written to the flash memory is encrypted by security IC 20 and security block 52 of the memory card. The security block has a buffer memory 53, a DES encryption circuit 54, and a nonvolatile memory 55. The security block has plural authentication keys and a storage key unique to each memory card. The nonvolatile memory stores the keys necessary for encryption and is not accessible from the outside. The storage key is stored in the nonvolatile memory.

In addition, security block 52 has a random number generator, allowing it to perform authentication with another recorder and to share session keys. For example, authentication is carried out when the memory card is first loaded into the recorder. This authentication is executed by the security IC and the security block of the memory card. When the recorder recognizes the loaded memory card and the memory card recognizes the recorder, cross authentication is established. When authentication is successfully made, the recorder and the memory card each generate a session key. Session keys are generated every time authentication is performed.

When data is written to the memory card, the recorder encrypts the data key using the session key and passes the encrypted data key to the memory card. The memory card then decrypts the received data key, re-encrypts it by the storage key, and passes the re-encrypted data key to the recorder. The storage key is unique to each memory card. Receiving the re-encrypted data key, the recorder executes format processing to write the re-encrypted data key and the encrypted data to the memory card.

When reading data from flash memory 42, the read data is supplied to page buffer 45, read register 48, and error correction circuit 49 through memory IF sequencer 51. The data held in the page buffer is corrected by the error correction circuit. The error-corrected output from the page buffer and the output of the read register are supplied to S/P & P/S IF block 43 and then to DSP 30 through the aforementioned serial interface.

When data is to be read, the data key encrypted by the storage key and the data encrypted by a block key are read from the flash memory. Then, the data key is decrypted by the security block by use of the storage key. The decrypted data key is encrypted by the session key to be sent to the recorder. The recorder decrypts the data key using the received session key. The recorder then generates a block key using the decrypted data key. By means of this block key, the encrypted ATRAC3 data is sequentially decrypted.

It should be noted that a configuration ROM 50 stores the version information of the memory card and various attribute information.

The memory card also has a switch 60 which can be operated by the user to protect the memory from erroneous deletion. When the switch is in the deletion disabled position, the flash memory cannot be deleted even if a deletion command comes from the recorder.

An oscillator 61 generates a clock signal to act as a timing reference for processing by the memory card.

3. File System 3-1. Processing Structure and Data Structure

Figure 4:
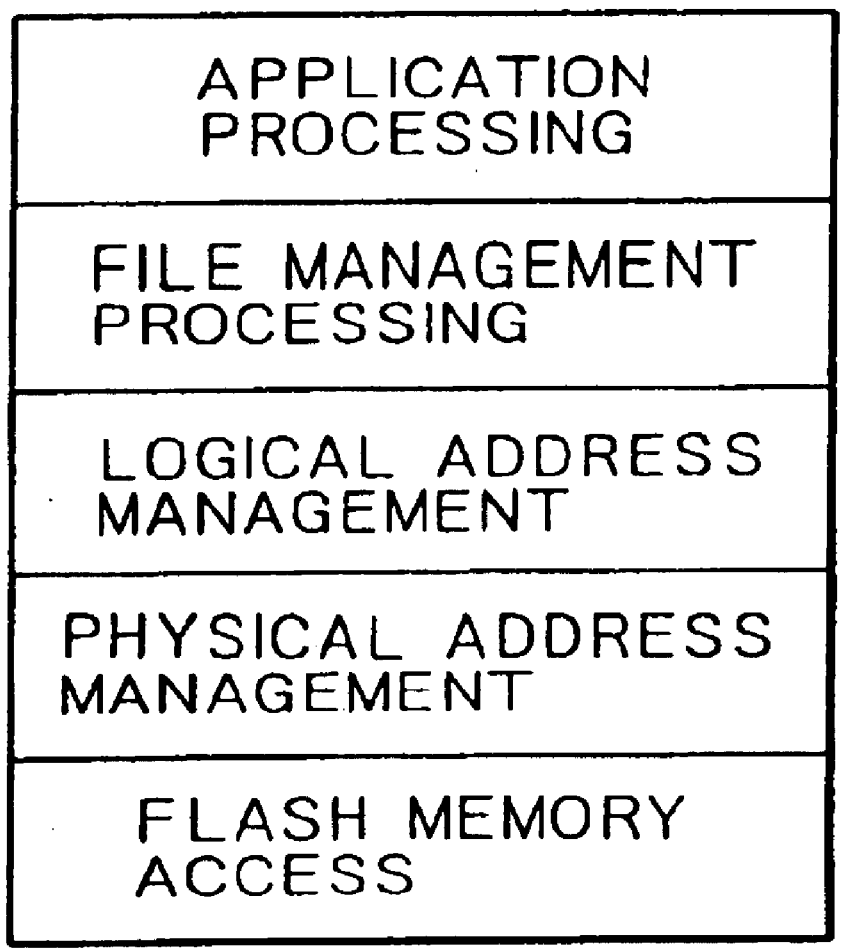
FIG. 4 is a diagram showing the configuration of a file system processing hierarchy used by the memory card shown in FIG. 3.

FIG. 4 shows a file system processing hierarchy for a recording medium using memory card 40. From the top is an application processing layer, followed by a file management processing layer, a logical address management layer, a physical address management layer, and a flash memory access layer. Within this hierarchical structure, the file management processing layer is a FAT file system. A physical address is given to each block of the flash memory. The relation between a block and its physical address is fixed. Further, logical addresses can be assigned to various blocks and are handled by the file management processing layer.

Figure 5:
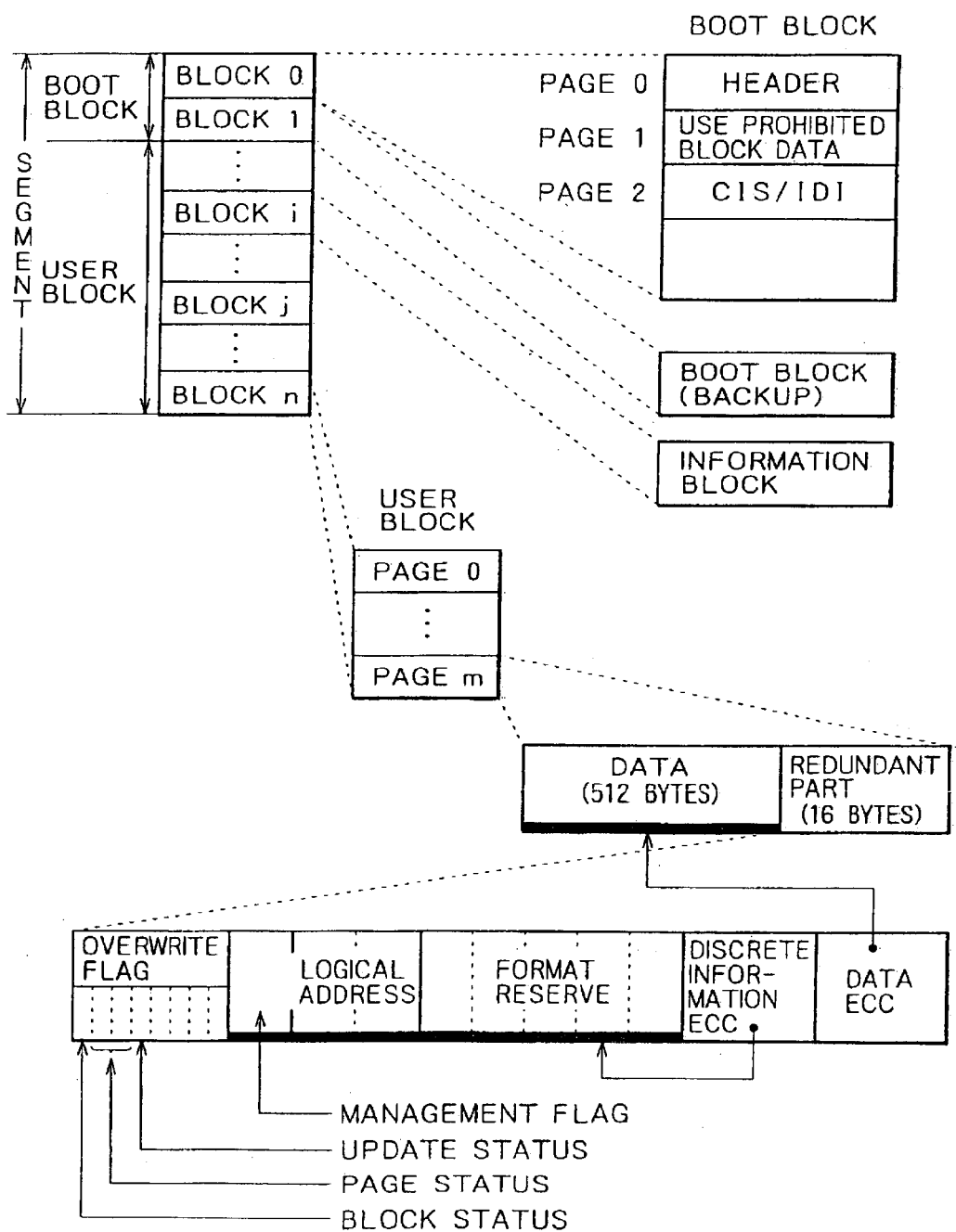
FIG. 5 is a diagram showing the data format used in the memory card shown in FIG. 3.

FIG. 5 shows an example of the physical configuration of data in flash memory 42 of memory card 40. In the flash memory the data is comprised of segments that are divided into a predetermined number of fixed length blocks, each block being further divided into a predetermined number of fixed length pages. In the flash memory, data is deleted on a block basis and read or written on a page basis.

One block is comprised of pages 0 through m. A block is 8 or 16 KB wide. One page is 512 bytes wide. Thus, the entire flash memory can be anywhere from 4 MB (512 blocks) to 64 MB (4,096 blocks) in size.

Each page is composed of a 512-byte data part and a 16-byte redundant part. The first three bytes of the redundant part form a 3-byte overwrite part where block status, page status, and update status are written. The remaining 13 bytes of the redundant part are fixed according to the contents of the data part. These 13 bytes include a management flag (1 byte), a logical address (2 bytes), a format reserved area (5 bytes), a discrete information ECC (2 bytes), and a data ECC (3 bytes). The discrete information ECC is error correction data for the management flag, the logical address, and the format reservation. The data ECC is error correction data for the 512-byte data.

In the management flag byte, a system flag (1=user block, 0=boot block), a conversion table flag (1=invalid, 0=table block), a copy inhibit specification (1=not prohibited, 1=prohibited), and an access permission (1=free, 0=read protected) are recorded.

The first two blocks of each segment, namely block 0 and block 1, form a boot block. Block 1 is a backup with the same data as block 0. The boot block is the first valid block in the memory card and therefore is accessed before all other blocks when the memory card is loaded in a device. The remaining blocks are user blocks. The first page (Page 0) of the boot block stores a header, a system entry, and boot and attribute information. Page 1stores data about unusable blocks. Page 2 stores CIS (Card Information Structure)/IDI (Identity Drive Information). The header of the boot block records a boot block ID and the number of valid entries in the boot block. The system entry records the start position of use-inhibited block data, the size thereof, the type thereof, the data start position of CIS/IDI, the size thereof, and the type thereof.

The boot and attribute information records the type of the memory card 40 (read only, readable and writable, or hybrid), a block size, a total number of blocks, security compliance, and data (date of manufacture and so on) associated with the production of the card.

Flash memories are subject to deterioration of the insulating film every time data is written. This limits the number of times data can be written to the flash memory. Therefore, it is preferable to avoid accessing the same storage area (block) repeatedly and continuously. When rewriting data, having a logical address and stored at a physical address, the file system prevents data from being written to the same block; the file system writes updated data to an unused block. Consequently, the correlation between logical address and physical address changes after each update. This processing (called swap processing) can prevent repeated and concentrated access to the same block, thereby increasing the useful life of the flash memory.

The logical address stays associated with the data, so that, the data changes blocks during an update, the same address is seen by the FAT; ensuring proper access thereafter. Swap processing causes a change in the correlation between logical and physical addresses, so that a logical-physical address conversion table is required. Looking at this conversion table identifies the physical address corresponding to the logical address specified by the FAT, thereby enabling access to the block indicated by the identified physical block.

The logical-physical address conversion table is stored by DSP 30 into SRAMs 31 and 36. If these SRAMs do not have enough space to store the table, it can be stored in the flash memory. This table lists logical addresses (2 bytes each) in ascending order along with their corresponding physical addresses. Since the maximum size of the flash memory is 128 MB (8,192 blocks), 8,192 addresses may be represented. In addition, the logical-physical address conversion table is managed for each segment, the size of the table increasing as the size of the flash memory increases. For example, if the size of the flash memory is 8 MB (2 segments), 2 pages of each segment are used for the logical-physical address conversion table.

When storing the logical-physical address conversion table into the flash memory, a predetermined bit of the management flag in the redundant part of each page indicates the block in which the table is stored.

The above-mentioned memory card is usable by the FAT system used in personal computers and disc storage media.

Although not shown in FIG. 5, the memory card contains an IPL area, a FAT area, and a root directory area arranged on the flash memory. The IPL area stores the address of the program loaded first into the memory and various information about the memory. The FAT area stores information associated with the blocks (clusters). The FAT specifies values indicative of unused blocks, a next block number, a defective block, and a last block. The root directory area stores directory entries (file attribute, update date, start cluster, and file size).

In the present embodiment, apart from the file management system specified by the format of the above-mentioned memory card, a reproduction management file is provided for managing the tracks of a music file and the parts constituting each track. This reproduction management file is stored by the user block of the memory card into the flash memory. Consequently, if the FAT stored in the memory card is damaged, file recovery is ensured.

The reproduction management file is created by the DSP. For example, when the recorder is powered on for the first time, it is determined whether the memory card is loaded. If the memory card is loaded, authentication is executed. If the memory card is found to be a compliant memory card, the boot block of the flash memory is read into the DSP. Then, the logical-physical address conversion table is read. The read data is stored in the SRAMs. If the memory card is virgin to the user, the FAT and the root directory are written to the flash memory before shipment. The reproduction management file is created when data is recorded by the user.

Specifically, when a record command is given by the user to the DSP, the received audio data is compressed by the encoder/decoder IC and the resultant ATRAC3 data is encrypted by the security IC. The DSP records the encrypted ATRAC3 data onto the flash memory, after which the FAT and the reproduction management file are updated.

Every time a file update operation is executed (i.e., every time the recording of audio data is started and ended,) the FAT and the reproduction management file are rewritten on the SRAMs. Then, when the memory card is detached from the recorder or when it is powered off, the last FAT and reproduction management files are stored from the SRAMs into the flash memory. In this case, the FAT and reproduction management files may be overwritten every time the recording of audio data is started and ended. When the audio data has been edited, the contents of the reproduction management file is updated.

Further, the present embodiment also creates an additional information file in the flash memory. It should be noted that this additional information file may be part of or separate from the reproduction management file.

The additional information is given to the DSP from an external controller through the bus and the bus interface 32.

The DSP records the received additional information to the flash memory. The additional information does not go through the security IC, so it is not encrypted. The additional information is written from the SRAM of the DSP to the flash memory when the memory card is detached from the recorder or when it is powered off.

3-2. Directory Structure

Figure 6:
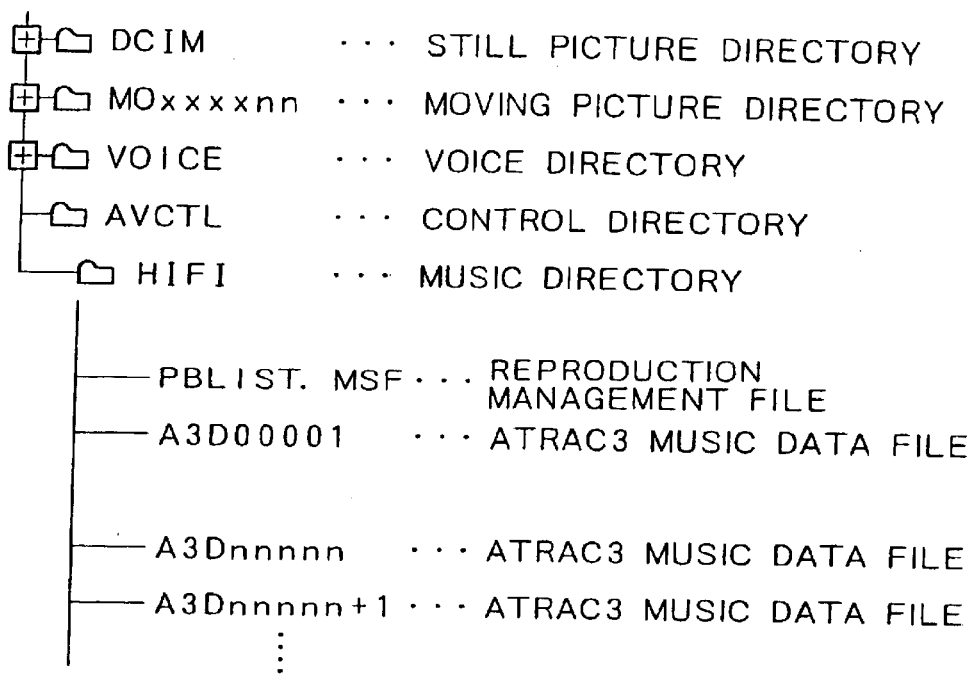
FIG. 6 is a diagram showing the directory structure used in the memory card shown in FIG. 3.

FIG. 6 shows a directory configuration or structure of memory card 40. As shown, a root directory is followed by a still picture directory, a moving picture directory, a voice directory, a control directory, and a music directory (HIFI). Each of these directories may have a data file and a management file for managing the data file. A folder having one or more data files may be formed. For exemplary purposes, the following description will describe recording/reproduction of music using the music directory.

The music directory has two types of files. One is a reproduction management file PBLIST.MSF (hereafter simply referred to as PBLIST). The other is an ATRAC3 data file A3Dnnn.MSA (hereafter simply referred to as A3Dnnn) that stores encrypted music data.

There can be up to 400 ATRAC3 data files. Each ATRAC3 data file is created, then registered in the reproduction management file.

The still picture directory (DCIM) may store a data file having still picture data and a reproduction management file for managing this data file. The moving picture directory (Moxxxxnn) may store a data file having moving data and a reproduction management file for managing this data file. These directories may have files of still picture data and moving picture data captured by a still camera and a video camera and copied from a disc medium such as a DVD.

The voice directory (VOICE) may store a data file having voice signals captures by a microphone and a reproduction management file for managing this data file.

3-3. Management Structure and Editing Scheme

Reproduction management file PBLIST and the ATRAC3 data file A3Dnnnn formed in the music directory (HIFI) will now be described.

Figure 7:
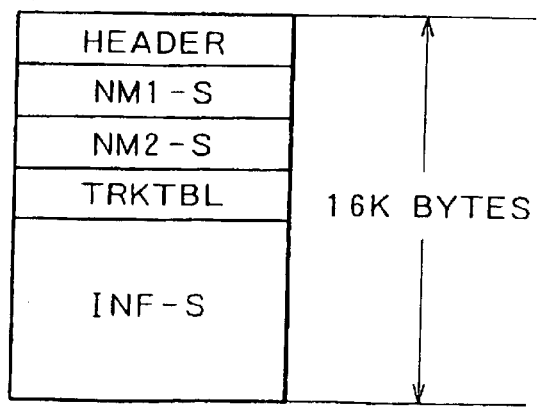
FIG. 7 is a diagram showing the configuration of a reproduction management file used in the memory card shown in FIG. 3.

FIG. 7 shows the structure or configuration of the reproduction management file. The reproduction management file has a fixed length of 16 KB and is composed of a header, a 1-byte memory card name HM1-S, a 2-byte code memory card name NM2-S, a reproduction table TRKTBL listing a sequence in which pieces of music are arranged, and additional information INF-S for the entire memory card.

Figure 8:
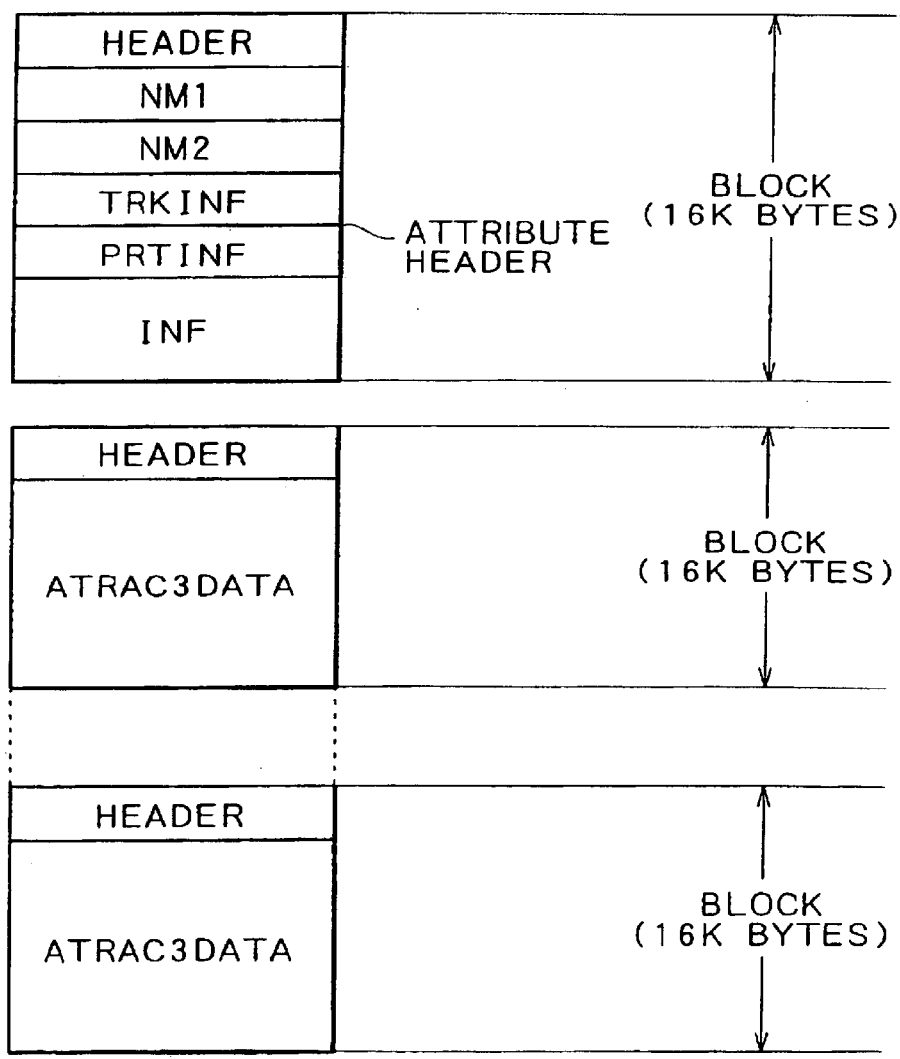
FIG. 8 is a diagram showing the configuration of an ATRAC3 music data file.

FIG. 8 shows the structure or configuration of an ATRAC3 data file (for one piece of music). The ATRAC3 data file (hereafter simply referred to as a data file) is provided for every piece of music and composed of an attribute header followed by the encrypted music data. The attribute header has a fixed length of 16 KB and has a configuration like that of the reproduction management file.

As shown in FIG. 8, the attribute header at the beginning of the data file is composed of a header, a 1-byte code music name NM1, a 2-byte code music name NM2, track information TRKINF such as track key information, part information PRTINF, and track additional information INF. The header includes a total number of parts, name attribute, additional information size, and so on. In this data file, the attribute header is followed by the ATRAC3 music data. The music data is divided into 16-KB blocks, each block beginning with a header. The header includes an initial value for decrypting the encrypted data. It should be noted that encryption is performed only on the music data.

Referring to FIGS. 9A, 9B, and 9C, the relation between the music (track) and an ATRAC3 data file will be described. One track denotes one piece of music, and is made up of one ATRAC3 data file (refer to FIG. 8). The ATRAC3 data file stores audio data compressed by the ATRAC3 scheme.

Data is recorded on the memory card on a cluster basis. Each cluster is 16 KB. No cluster has more than a single file. The minimum unit by which the flash memory is erased is one block. In the case of a memory card for use in recording music data, a block and a cluster are synonymous and one cluster is defined as a sector.

One piece of music basically constitutes one part. When a piece of music is edited, it may constitute two or more parts. A part denotes a unit of data recorded in a continuous time from the beginning of recording to its end. Normally, one track constitutes one part.

When one piece of data has two or more parts, the joints between parts are managed by part information PRTINF (to be described later) in the attribute header of each piece of music. To be more specific, a part size is indicated by 4-byte data called part size PRTSIZE in the PRTINF. The first two bytes of the part size PRTSIZE indicate the total number of clusters for that part. The subsequent bytes indicate the position of a start sound unit (abbreviated as SU) and an end SU in start and end clusters.

This part description scheme eliminates the necessity for moving large amounts data when editing music data. If music data is edited only on a block basis, unnecessary moving of data may be avoided; however, blocks are too large to efficiently use in editing.

The SU is the minimum unit of a part and the minimum data unit used when audio data is compressed using ATRAC3. Each SU contains several hundred bytes of data obtained by compressing audio data (1,024×16 bits×2 channels at 44.1 KHz) into 1/10 of its original size. One SU is equivalent to about 23 ms. Normally, one part is composed of as many as several thousand SUs. When one cluster is composed of 42 SUs, that cluster represents about one second of music. The number of parts constituting a track depends on the size of the additional information. The number of parts is determined by the number obtained by removing the header, music name, and additional information data from a block, so that the maximum number of parts (645) may be used.

FIGS. 9A, 9B, and 9C show a file configuration for two pieces of music continuously recorded from a CD. FIG. 9A shows a case in which one piece (data file #1) constitutes five clusters (CL0 through CL4). FIG. 9C shows a case in which two pieces (data file #2) constitute six clusters (CL5 through CL10). Since only one file can be stored in a cluster, data file #2 is created from the beginning of the next cluster (CL5). Consequently, if the end (the end of music 1) of data file #1 is located halfway into a cluster, no data is recorded in the remaining portion of that cluster as shown in FIG. 9B. In the above-mentioned example, each of data files #1 and #2 constitute one part.

For data files recorded on a memory card, four types of edit processing are specified; divide, combine, erase, and move. Divide processing divides one file in the file system into two and updates the reproduction management file. Combine processing combines two files in the file system into one and updates the reproduction management file. Erase processing erases a track. Move processing changes the sequence of the tracks and the reproduction management file is updated.

It should be noted that "move" processing does not involve the movement of data. Therefore, "move" in editing is different from moving data from one recording medium to another recording medium. As described, a "move" of data between recording media is achieved by copying the data and then deleting it from the source recording medium.

A result of combining two files (data files #1 and #2 shown in FIGS. 9A, 9B, and 9C) is shown in FIG. 10. The two data files #1 and #2 are combined into new data file #1. New data file #1 is made up of two parts.

FIG. 11 shows the result of dividing one piece of music (data file #1 shown in FIG. 9A) midway in cluster 2. Divide processing results in data file #1 made up of clusters 0 and 1 and a front portion of cluster 2 and data file #2 made up of a rear portion of cluster 2 and clusters 3 and 4.

Two files may not be permitted to exist in one cluster, so that in divide editing with a certain position in the cluster CL2 being the dividing point, the data of cluster CL2 may be copied first into empty cluster CL11. In data file #2, a position equivalent to the dividing point in cluster CL11 is the start point, cluster CL11 being followed by clusters CL3 and CL4. As a result, in the case of divide editing, a new cluster may be used in addition to updating the reproduction management file.

As described, in the present embodiment, the part description scheme is provided, so that the start and end positions of part 1 and the start and end positions of part 2 can be specified by SU unit. Consequently, it becomes unnecessary to move the music data of part 2 to fill the joint resulted from the combine processing. In addition, the part description scheme makes it unnecessary to move the data so that the space at the beginning of data file #2 resulted from the divide processing (FIG. 11) is filled.

3-4. Reproduction Management File

FIG. 12 shows the detailed data configuration of the reproduction management file PBLIST. The reproduction management file PBLIST is one cluster (1 block 16 KB) in size. The first 32 bytes are a header.

The remaining portion contains a name NM1-S (256 bytes) for the entire memory card, a name NM2-S (512 bytes), a DATA KEY, an MAC, an S-YMDhms, a table TRKTBL (800 bytes) for managing the sequence of reproduction, and additional information INF-S (14,720 bytes) for the entire memory card. At the end of this file, part of the information in the header is recorded again. The different data is located at predetermined positions in the reproduction management file.

In the reproduction management file, the first 32 bytes represented by (0x0000) and (0x0010) are the header. Note that every 16 bytes, from the beginning of the file, is called a slot.

"Reserved" denotes undefined data and is normally indicated by a null (0x00). The reserved data is ignored. The position of reserved data is also write-protected. Data denoted "Option" is handled in the same manner as reserved data. The header is arranged in the first and second slots and contains the following data.

BLKID-TL0 (4 bytes)
Meaning: block file ID.
Function: a value for identifying the beginning of the reproduction management file.
Value: "TL=0" (for example, 0x544C2D30).

MCcode (2 bytes)
Meaning: maker code.
Function: the code for identifying the maker and the model of a device on which recording has been made.
Value: high-order 10 bits (maker code) and low-order 6 bits (model code).

REVISION (4 bytes)
Meaning: the number of times the reproduction management file (PBLIST) has been rewritten.
Function: REVISION increments every time the reproduction management file has been rewritten.
Value: starts from 0 and increments by one.

SN1 C+L (2 bytes)
Meaning: the attribute of the name (1 byte) of the memory card to be written to the NM 1-S area.
Function: SN1C+L represents a character code and a language code to be used in one byte each.
Value: character code (C) identifies characters by a high-order byte as shown below:
  00: no character code is set; handled simply as a binary number.
  01: ASCII 02: ASCII+KANA 03: modified 8859-1
  81: MS-JIS 82: KS C 5601-1989 83: GB2312-80
  90: S-JIS (for Voice).
  Language code (L) identifies languages by low-order 1 byte as per EBU Tech 3258 as shown below:
    00: not set. 08: German 09: English 0A: Spanish 0F: French
    15: Italian 1D: Dutch 65: Korean 69 Japanese 75: Chinese
If there is no data, zeros are filled.

SN2C+L (2 bytes)
Meaning: the attribute of the name (2 bytes) of the memory card to be written to the NM2-S area.
Function: SN2C+L represents a character code and a language code to be used in one byte each.
Value: the same as the above-mentioned SNIC+L.

SINFSIZE (2 bytes)
Meaning: the size obtained by adding all additional information associated with the entire memory card to be written to the INF-S area.
Function: SINFSIZE describes a data size in a unit of 16 bytes; if there is no data, zeros are filled.
Value: the size is from 0x0001 to 0x39C (924).

T-TRK (2 bytes)
Meaning: total track number.
Function: the number of total tracks.
Value: 1 to 0x0190 (up to 400 tracks); if there is no data, zeros are filled.

VerNo (2 bytes)
Meaning: the version number of the format.
Function: high-order indicates major version number and low-order indicates minor version number.
Value: example 0x0100 (Ver 1.0), 0x0203 (Ver 2.3)

The data that follow the above-mentioned header are as follows:

NM1-S
Meaning: the name of one byte associated with the entire memory card.
Function: variable-length name data (up to 256) represented in 1-byte character code. The name data always ends with a termination code (0x00). The size is counted from this termination code. If there is no data, a null (0x00) is recorded at least 1 byte from the beginning (0x0020).
Value: various character codes.

NM2-S
Meaning: the 2-byte name associated with the entire memory card.
Function: the variable-length name data (up to 512) represented in a 2-byte character code. The name data always ends with a termination code (0x00). The size is counted from this termination code. If there is no data, a null (0x00) is recorded at least 2 bytes from the beginning (0x0120).

Value: various character codes.

DATA KEY

Meaning: a value prepared for each piece of music. This value is protected by MG (M) and then stored. The value here is the same as the DATA KEY attached to the first piece of music.

Function: the key necessary for computation of MAC of S-YMDhms.

Value: from 0 to 0xFFFFFFFFFFFFFFFF.

MAC

Meaning: the value for checking for tamper of copyright information.

Function: the value created from the contents of S-YMDhms and the DATA KEY.

Value: from 0 to 0xFFFFFFFFFFFFFFFF.

TRK-nnn

Meaning: SQN (sequence) number of the ATRAC3 data file to be reproduced.

Function: TRK-nnn describes FNo in TRKINF.

Value: from 1 to 400 (0x190). If there is no data, zeros are filled.

INF-S

Meaning: additional information data (for example, information about photograph, lyrics, and description) associated with the entire memory card.

Function: variable-length additional information data accompanying a header. Two or more different pieces of additional information may be arranged, each being attached with ID and data size. Each piece of additional information data including a header is at least 16 bytes in integral multiples of 4 bytes. Details of this will be described later.

Value: refer to the configuration of additional information data.

S-YMDhms (4 bytes) (optional)

Meaning: Year, month, day, hour, minute and second of recording made by a device having a reliable clock.

Function: the value for identifying the last recording date and time; essential for EMD.

Value: bits 25 to 31: year 0 to 99 (1980 to 2079)
bits 21 to 24: month 0 to 12
bits 16 to 20: day 0 to 31
bits 11 to 15: hour 0 to 23
bits 05 to 10: minute 0 to 59
bits 00 to 04: second 0 to 29 (in unit of 2 seconds)

In the last slot of the reproduction management file, the same BLKID-TL0, MCode, and REVISION as those in the header are written.

As an example, in a consumer audio system, a memory card may be detached during recording or the system powered off inadvertently, thereby requiring detection of abnormal conditions upon recovery of the system. As described, REVISION is written at the beginning and end of each block and each time REVISION is written, the rewrite count is incremented by 1. Consequently, if an abnormal condition occurs while recording a block, the values of the beginning REVISION and end REVISION will not agree, thereby allowing for detection of the abnormal condition. Thus, the two REVISIONs allows for detection of abnormal conditions. When an abnormal condition is detected, an error message is displayed.

Because fixed value BLKID-TL0 is inserted at the beginning of each block, this fixed value may be used as a guide for repair of a damaged FAT. Specifically, by checking the fixed value at the beginning of each block the type of file can be determined. In addition, because this fixed value BLKID-TL0 is written to both the header and the end of each block, its reliability can be checked.

Compared with the reproduction management file, an ATRAC3 data file contains a fairly large amount of data (e.g., sometimes several thousand concatenated blocks). Each ATRAC3 data file has a block number BLOCK SERIAL attached. Normally, each ATRAC3 data file occupies two or more blocks on the memory card. Therefore, unless the data is identified by CONNUMO and BLOCK SERIAL, duplication can occur, thereby making recovery difficult upon damage to the FAT.

Likewise, in case a file develops logic errors, a maker code (MCode) is recorded at the beginning and end of each block for identification of the model of the device on which the recording was made.

FIG. 13 shows the configuration of additional information data (INF-S) recorded in the reproduction management file. The additional information starts with a header, as shown below, followed by variable-length data.

Meaning: field ID.

Function: a fixed value indicative of the beginning of additional information data.

Value: 0x69.

ID

Meaning: an additional information key code.

Function: ID indicates the classification of additional information.

Value: from 0 to 0xFF.

SIZE

Meaning: the size of individual additional information.

Function: the data size is free but must always be an integral multiple of 4 bytes and at least 16 bytes. If the data end with a space, it is filled with null (0x00).

Value: from 16 to 14784 (0x39C0).

MCode

Meaning: maker code.

Function: the code for identifying the maker and the model of a device on which recording has been made.

Value: high-order 10 bits (maker code) and low-order 6 bits (model code).

C+L

Meaning: the attribute of characters to be written in a data area starting from byte 12.

Function: a character code and a language code to be used is represented in 1 byte each.

Value: same as the above-mentioned SN1C+L.

DATA

Meaning: individual additional information data.

Function: DATA represents in variable-length data. The real data always starts from byte 12 and must be at least 4 bytes in length (size) and always an integral multiple of 4 bytes. If the data end with a space, it is filled with null (0x00).

Value: individually defined according to contents.

FIG. 14 shows an example of the correlation between additional information key code values 0 to 63 and additional information types. Key code values 0 to 31 are assigned to music-associated information (character information) and key code values 32 to 63 are assigned to URL (Uniform Resource Locator) internet-associated information. Character information such as album title, artist name, and CM is recorded as additional information.

FIG. 15 shows more examples of the correlation between additional information key code values (64 to 127) and additional information types. Key code values 64 to 95 are assigned as paths/other information and key code values 96 to 127 are assigned to control/numeric data. For example, if the key code ID=90, the additional information is DISC-ID which is an ID having information included in TOC information of a compact disc (CD), namely, information including a first track number, a last track number, a start time (or an address) of each track, and a start time (an address) of a lead-out track. Further, if the key code ID=98, the additional information is TOC-ID which is generated by use of the information included in TOC information. For example, information pertaining to the total number of pieces of music known from TOC information and a value formed from reproduction time provide the TOC-ID value. The DISC-TOC and TOC-ID may provide an identifier for identifying a disc from which-data has been recorded. Furthermore, if the key code ID=97, the additional information may provide ISRC (International Standard Recording Code: copyright code). This may also provide an identifier for identifying a recording medium from which data has been recorded.

FIG. 16 shows still further examples of the correlation between additional information key code values (128 to 159) and additional information types. Key code values 128 to 159 are assigned to the information associated with synchronous reproduction. In FIG. 16, EMD denotes electronic music distribution.

Figures 17A, 17B, 17C, 17D, 17E:
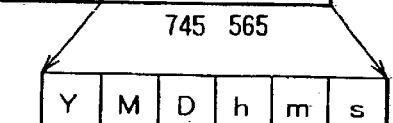
FIGS. 17A–E are diagrams showing specific data configurations of additional information for one embodiment of the invention.

In reference to FIGS. 17A, 17B, 17C, 17D, and 17E, specific examples of additional information data will be described. FIG. 17A shows a data structure of additional information data consistent with FIG. 13.

FIG. 17B shows an example in which the additional information is an artist's name, i.e. key code ID=3. SIZE is 0x1C (28 bytes). The data length of this additional information including the header is 28 bytes. Within C+L, the character code C is 0x01 and the language code L is 0x09. This value is an ASCII character code that indicates the language is English according to the specification shown above. The artist name data, "SIMON&ABCDEFGHI", for example is written in one byte starting from byte 12. Since the size of additional information is specified as an integral multiple of 4 bytes, the remaining one byte is (0x00).

FIG. 17C shows an example in which the additional information is ISRC (International Standard Recording Code: copyright code), i.e. key code ID=97. SIZE is 0x14 (20 bytes), indicating that the data length of this additional information is 20 bytes. For C+L, C=0x00 and L=0x00, indicating that neither character nor language is set; namely, the data is binary. Then, an 8-byte ISRC code is written as the data. ISRC indicates copyright information (country, copyright holder, recording date, and serial number).

FIG. 17D shows an example in which the additional information is a recording date, i.e. key code ID=97. SIZE is 0x10 (16 bytes), indicating that the data length of this additional information is 16 bytes. For C+L, C=0x00 and L=0x00, indicating that neither character nor language is set. Then, a 4-byte (32 bits) code is written as the data, indicating a recording date (year, month, day, hour, minute, second).

FIG. 17E shows an example in which the additional information is a reproduction log, i.e. key code ID=107. SIZE is 0x10 (16 bytes), indicating that the data length of this additional information is 16 bytes. For C+L, C=0x00 and L=0x00, indicating that neither character nor language is set. Then, a 4-byte (32 bits) code is written as the data, indicating a reproduction log (year, month, day, hour, minute, second). The reproduction log records 16 bytes of data every time reproduction is performed.

3-5. Data File

FIG. 18 shows a data array for an ATRAC3 data file (A3Dnnnn) in which one SU is N bytes (for example, N=384 bytes). FIG. 18 shows in detail a data file similar to that shown in FIG. 8. Specifically, the figure shows the start bytes (0x0000 through 0x7FF0) of the slots of the first two blocks (16×2=32K bytes).

The first 32 bytes of the attribute header are the header, followed by 256 bytes for music name area NM1 (256 bytes) and 512 bytes for music name area NM2 (512 bytes). The header of the attribute header includes the following data.

BLKID-HD0 (4 bytes)
Meaning: block file ID.
Function: a value for identifying the beginning of ATRAC3 data file.
Value: fixed value="HD=0" (for example, 0x48442D30).

MCode (2 bytes)
Meaning: maker code.
Function: the code for identifying the maker and the model of a device on which recording has been made.
Value: high-order 10 bits (maker code) and low-order 6 bits (model code).

BLOCK SERIAL (4 bytes)
Meaning: a serial number attached to each track.
Function: the first block starts with 0, subsequent blocks having serial numbers in increment of 1; these numbers remain unchanged after edit processing.
Value: from 0 to 0xFFFFFFFF.

N1C+L (2 bytes)
Meaning: the attribute of track (music name) data (NM1).
Function: a character code and a language code for use in NM1 are represented in 1 byte each.
Value: same as SN1C+L.

N2C+L (2 bytes)
Meaning: the attribute of track (music name) data (NM2).
Function: a character code and a language code for use in NM2 are represented in 1 byte each.
Value: same as SN1C+L.

INFSIZE (2 bytes)
Meaning: a size obtained by totaling all pieces of additional information associated with track.
Function: INFSIZE describes a data size in unit of 16 bytes. If there is no data, zeros are filled.
Value: the size is 0x0000 to 0x3C6 (966).

T-PRT (2 bytes)
Meaning: the total number of parts.
Function: T-PRT represents the number of parts constituting a track; normally 1.
Value: from 1 to 0x285 (645 dec).

T-SU (4 bytes)
Meaning: the total number of SUs.
Function: T-SU represents the actual total number of SUs in one track; equivalent to a music reproduction time.
Value: from 0x0I to 0x001 FFFFF.

INX (2 bytes) (optional)

Meaning: the relative position of INDEX.

Function: the pointer indicative of the beginning of a characteristic portion of music, specifying the position from the beginning of music by a value obtained by dividing the number of SUs by 4; equivalent to a duration of time (about 93 ms) four times as long as normal SU.

Value: from 0 to 0xFFFF (up to about 6084 seconds).

XT (2 bytes) (optional)

Meaning: the reproduction time of INDEX.

Function: XT specifies the time to be reproduced from the beginning specified by INX-nnn by a value obtained by dividing the number SUs by 4; equivalent to a duration of time (about 93 ms) four times as long as a normal SU.

Value: 0x0000: no setting; from 0x01 to 0xFFFE (up to 6084 seconds).

0xFFFF: up to the end of music.

The following describes music name areas NM1 and NM2 in the attribute header.

NM1

Meaning: a character string indicative of music name.

Function: a variable-length music name (up to 256) represented in a 1 byte character code. The name data always end with a termination code (0x00). The size is computed from this termination code. If there is no data, one or more bytes of null (0x00) are recorded at least from the beginning (0x0020).

Value: each type of character code.

NM2

Meaning: a character string indicative of music name.

Function: variable-length name data (up to 512) represented in a 2-byte character code. The name data always end with a termination code (0x00). The size is computed from this termination code. If there is no data, two or more bytes of null (0x00) are recorded at least from the beginning (0x0120).

Value: each type of character code.

The 80-byte data starting from fixed position 0x0320 of the attribute header is called the track information area TRKINF, which manages information associated with security and copy control. The following describes the data in TRKINF.

DATA KEY (8 bytes)

Meaning: a value prepared for each piece of music, which is protected by the security block of the memory card and then stored.

Function: a first key which becomes necessary for reproduction of music and used for computing C-MAC[n].

Value: from 0 to 0xFFFFFFFFFFFFFFFF.

C-MAC[n] (8 bytes)

Meaning: a value for checking for tamper of copyright information.

Function: a value created from the contents of plural TRKINFs including content accumulation number and a hidden sequence number. The hidden sequence number denotes a sequence number recorded in a hidden area of the memory card. Any recorder not compliant with copyright cannot read the hidden area. A dedicated recorder compliant with copyright or a personal computer installed with software capable of reading the memory card can access the hidden area.

A (1 byte)

Meaning: the attribute of a part.

Function: information such as a compression mode in a part.

Value: See FIG. 19. Monaural mode (N=0, 1) is a special joint mode in which bit 7 is 1 and the sub signal is 0. Only the main signal (L+R) can be specified as monaural. Normal reproducing devices may ignore the information in bits 2 and 1.

Bit 0 of A forms information of emphasis on/off. Bit 1 forms information about reproduction SKIP or normal reproduction. Bit 2 forms information about data division; for example, audio data or other data such as FAX. Bit 3 is undefined. By combining bits 4, 5 and 6, rate information is specified as shown.

More specifically, N denotes a rate value represented in three bits, indicating recording time (in the case of a 64-MB memory card), data transfer rate, the number of SUs in one block, and the number of bytes of one SU for five types of modes; monaural (N=0), LP (N=2), SP (N=4), EX (N=5, 6), and HQ (n=7). Bit 7 indicates the mode (0: dual, 1: joint) of ATRAC3.

The following describes the case of SP mode by use of a 64-MB memory card. The 64-MB memory card has 3968 blocks. In the SP mode, one SU has 304 bytes, so that one block has 53 SUs. One SU is equivalent to (1,024/44,100) seconds. Therefore, one block is $(1,024/44,100) \times 53 \times (3,968-16)=4,863$ seconds=81 minutes. The transfer rate is $(44,100/1,024) \times 304 \times 8=104,737$ bps.

LT (1 byte)

Meaning: a reproduction limit flag (bit 7 and bit 6) and a security version (bit 5 through bit 0).

Function: LT indicates that there is a limitation to this track.

Value: bit 7: 0=not limited; 1=limited. bit 6: 0=within limit of time; 1=out of limit of time. bit 5 through bit 0: security version 0 (if security version is other than 0, reproduction is inhibited).

FNo (2 bytes)

Meaning: a file number.

Function: a track number at the first recording and this number identifies the position of a value for MAC computation recorded in the hidden area of the memory card.

Value: from 1 to 0x190 (400).

MG (D) SERIAL-nnn (16 bytes)

Meaning: the serial number of a security block (the security IC 20) of the recording device.

Function: a unique value which is different between recording devices.

Value: from 0 to 0xFFFFFFFFFFFFFFFFFFFFFFFFFFFFFFFF.

CONNUM (4 bytes)

Meaning: a content accumulation number.

Function: a unique value to be accumulated for each piece of music and managed by the security block of the recording device. This number is prepared for 2 to the 32nd power, or 4.2 billion pieces of music and is used for identifying recorded music.

Value: from 0 to 0xFFFFFFFF.

YMDhms-S (4 bytes) (optional)

Meaning: the reproduction start date for a track subject to reproduction limit.

Function: the date on which reproduction start specified by EMD is permitted.

Value: same as the notation of the above-mentioned date.

YMDhms-E (4 bytes) (optional)

Meaning: the reproduction end date for a track subject to reproduction limit.

Function: the date on which reproduction permission specified by EMD is ended.

Value: same as the notation of the above-mentioned date.

MT (1 byte) (optional)

Meaning: the maximum number of times reproduction is permitted.

Function: the maximum number of reproduction times specified by EMD.

Value: from 1 to 0xFF; 0x00 when this is not used. If bit 7 of LT is 0, the value of MT is 00.

CT (1 byte) (optional)

Meaning: the number of times reproduction is made.

Function: the number of times music can be actually reproduced within the permitted number of reproduction times. This value is decremented every time reproduction is made.

Value: 0x00 to 0xFF; 0x00 when this is not used. If bit 7 of LT is 1 and the value of CT is 00, reproduction is inhibited.

CC (1 byte)

Meaning: COPY CONTROL.

Function: copy control.

Value: as shown in FIG. 20, bit 6 and bit 7 represent copy control information, bit 4 and bit 5 represent copy control information associated with high-speed digital copy, and bit 1, bit 2, and bit 3 represent a copy attribute, bit 0 being undefined.

Example of CC: Bit 7: 0; copy protected, 1; copy enabled.

Bit 6: 0; original, 1; first generation or higher.

Bits 5,4: 00; copy protected, 01; copy first generation, 10; copy enabled.

Bits 3,2,1:
  001; data recorded from original source.
  010; data copied from LCM.
  011; data moved from LCM.
  100 or higher; undefined.

It should be noted that LCM stands for Licensed Compliant Module, which is equivalent to the HDD in a personal computer or device. For example, in digital recording from a CD, (bits 7, 6) are 01, (bits 5,4) are 00, and (bits 3,2,1) are 001 or 010.

CN (1 byte) (optional)

Meaning: the number of times copy is permitted in high-speed digital copy HSCMS (High Speed Serial Copy Management System).

Function: CN extends distinction between copy once and copy free and specifies by the number of times; CN is valid only for first generation copy and decrements every time copy is made.

Value: 00: copy protected, 01 to 0xFE: number of times, 0xFF: infinite number of times.

In the attribute header in the data file, the above-mentioned track information TRKINF is followed by 24-byte data starting from 0x0370 called a part information area PRTINF for part management. When one track is made up of plural parts, PRTINFs are arranged along the time axis. The following describes the data contained in PRTINF.

PRTSIZE (4 bytes)

Meaning: a part size.

Function: PRTSIZE indicates the size of a part; cluster: 2 bytes (top), start SU: 1 byte (middle), end SU: 1 byte (bottom).

Value: cluster: from 1 to 0x1F40 (8000), start SU: from 0 to 0xA0 (160), end SU: from 0 to 0xA0 (160) (SUs are numbered from 0).

PRTKEY (8 bytes)

Meaning: a value for encrypting a part.

Function: an initial value=0; at the time of editing, PRTKEY follows editing rules.

Value: from 0 to 0xFFFFFFFFFFFFFFFF.

CONNUM0 (4 bytes)

Meaning: a first created content accumulation number key.

Function: CONNUM0 serves as the ID for making content unique.

Value: same as the content accumulation number initial value key.

The attribute header of an ATRAC3 data file contains additional information INF as shown in FIG. 18. This information is generally the same as the additional information INF-S (refer to FIG. 12) in the reproduction management file except that the start position is not fixed. The additional information INF starts at the position next to the last byte portion (in units of 4 bytes) of one or more parts.

INF

Meaning: the additional information data associated with tracks.

Function: variable-length additional information data with header. Plural different kinds of additional information may be arranged. Each header is attached with ID and data size. The additional information data including individual headers are at least 16 bytes long and increment in an integral multiple of 4 bytes.

Value: same as additional information INF-S in the reproduction management file.

The above-mentioned attribute headers are followed by the data blocks to which the ATRAC3 data is recorded. As shown in FIG. 8, a header is attached to each block. The following describes the block data with reference to FIG. 18.

BLKID-A3D (4 bytes)

Meaning: BLOCK ID FILE ID.

Function: BLKID-A3D identifies the beginning of ATRAC3 data.

Value: fixed value="A3D" (for example, 0x41334420).

MCode (2 bytes)

Meaning: MAKER CODE

Function: MCode identifies the maker and model of the device on which recording has been made.

Value: high-order 10 bits (maker code); low-order 6 bits (model code).

CONNUMO (4 bytes)

Meaning: a first created content accumulation number.

Function: CONNUM0 serves as the ID for making data unique and allows no value change after editing.

Value: same as the content accumulation number initial value key.

BLOCK SERIAL (4 bytes)

Meaning: a serial number attached to each track.

Function: the first block starts with 0, subsequent blocks having serial numbers in increment of 1; these numbers remain unchanged after edit processing.

Value: from 0 to 0xFFFFFFFF.

BLOCK-SEED (8 bytes)

Meaning: one key for encrypting one block.

Function: the start block is a security block for the recording device and generates random numbers. The following blocks are numbered in increment of one. If this value is lost, no sound is outputted for about one second equivalent to one block. Therefore, the same value is written to the header and the block end in a duplicate manner. The value is not changed after editing.

Value: initially, 8-byte random number.

INITIALIZATION VECTOR (8 bytes)

Meaning: this is an initial value necessary for encrypting and decrypting ATRAC3 data for each block.

Function: the first block starts from 0 and the next block has a last encrypted 8-byte value of the last SU. When starting halfway in a divided block, the last 8 bytes immediately before the start SU are used. This value is not changed after editing.

Value: from 0 to 0xFFFFFFFFFFFFFFFF.

SU-nnn

Meaning: sound unit data.

Function: data obtained by compressing 1,024 samples. The number of bytes of the data depends on the compression mode used. The value is not changed after editing (for example, N=384 bytes in SP mode).

Value: ATRAC3 data value.

In FIG. 18, N=384, so that 42 SUs are written to one block. The first two slots (4 bytes) of each block form a header. BLKID-A3D, MCode, CONNUM0, and BLOCK SERIAL are written to the last slot (2 bytes) in a duplicate manner. Therefore, the remaining area, M, of each block is 16,384−384×42−16×3=208 bytes. As described above, the 8-byte BLOCK SEED is written to this area M.

4. Configuration of a Device Having a HDD

The recorder 1 usable with the memory 40 described with reference to FIG. 1 may be a stand-alone device or may be incorporated into another device. For example, a recorder for the memory card 40 may be arranged in the main body of a personal computer having a HDD (Hard Disc Drive). In such case, the configuration shown in FIG. 1 may be arranged without change into the main body of the personal computer. Alternatively, the configuration shown in FIG. 21 may be used in which a central processing unit (CPU) 202 directly controls a HDD 201 and the memory card 40. Data encoding/decoding and encryption processing for the memory card 40 may be executed in a manner similar to those for the recorder 1 shown in FIG. 1. The configuration shown in FIG. 21 will now be. further described.

Figure 21:
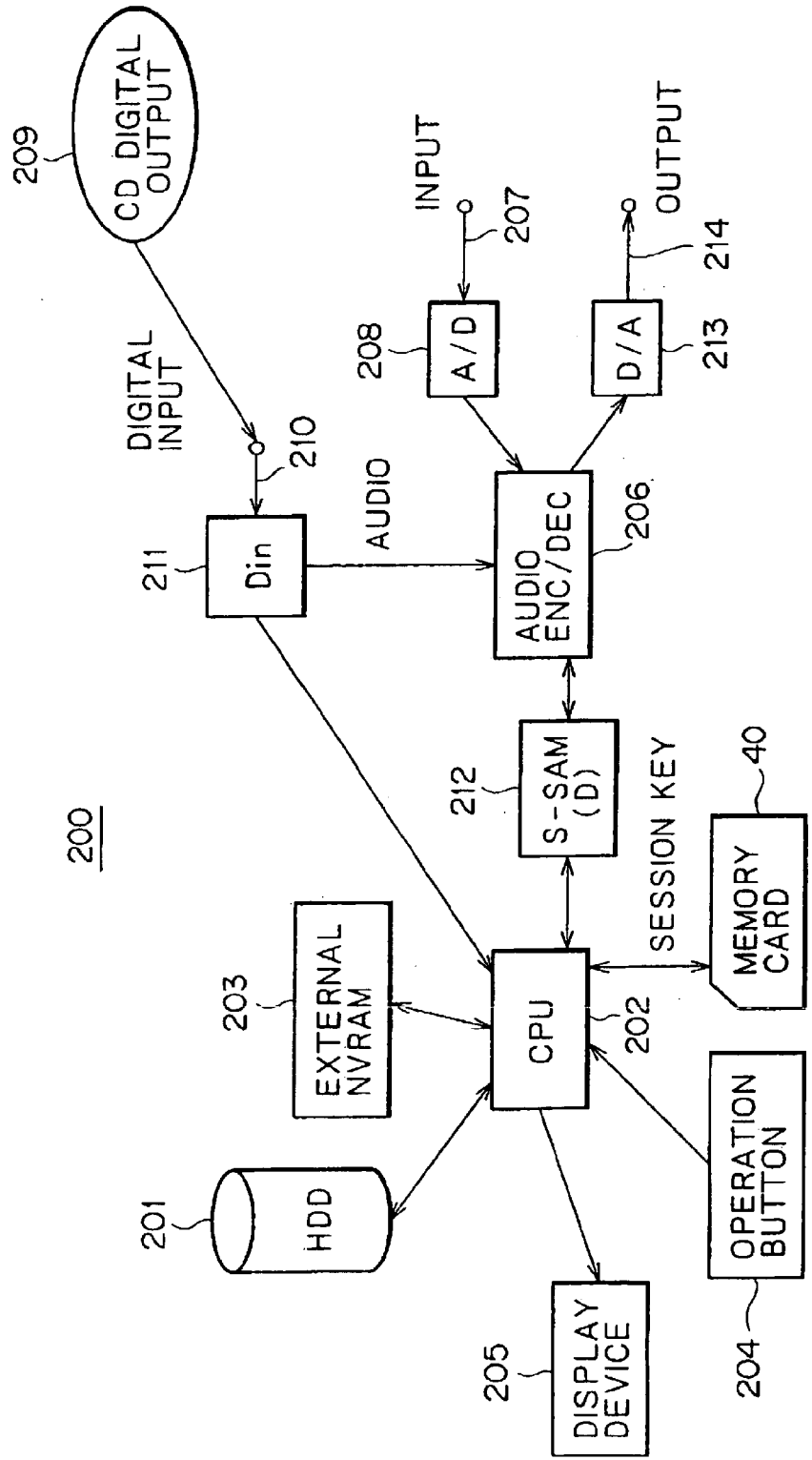
FIG. 21 is a diagram of an apparatus having a HDD.

In the configuration of FIG. 21, a reproduced digital signal from a CD player may be stored on the hard disc, which may be used as an audio server. Such digital signal may be copied or supplied from the hard disc to the memory card 40 having the above-mentioned format. The signal recorded to the memory card 40 may be reproduced by a recorder (such as a stationary or portable type recorder) such as shown in FIG. 1. Alternatively, a stand-alone recorder 1 which may be connected to a personal computer having a HDD may be. utilized.

The configuration or apparatus of FIG. 21 includes a personal computer 200 having HDD 201 which is operated or controlled by CPU 202. The CPU 202 may be coupled to an external non-volatile memory (an external NVRAM) 203, an operation button 204, and a display device 205.

Additionally, the FIG. 21 configuration may include an ATRAC3 audio encoder/decoder 206, a digital input receiver 211, and a security block 212.

An analog input 207 may be converted by an analog-to-digital (A/D) converter 208 into a digital audio signal and supplied to the audio encoder/decoder 206 so as to be compressed thereat in accordance with an ATRAC3 scheme. Additionally, a digital input 210 from a CD player 209 may be supplied through the digital input receiver 211 to the audio encoder/decoder 206 so as to be compressed in accordance with the ATRAC3 scheme. The CD player 209 may be an externally attached CD player, a CD-ROM drive mounted on the personal computer, and the like. The compressed audio data from the audio encoder/decoder 206 may be supplied to the security block 212 to be encrypted. In addition, the personal computer 200 may decrypt the data (audio data) stored in the HDD 201, decode the decrypted data into a digital audio signal by use of the audio encoder/decoder 206, and convert such digital audio signal into an analog audio output 214 by use of digital-to-analog (D/A) converter 213.

Encryption may be executed or performed by use of a data key in a manner similar to that utilized with the recorder 1.

Encrypted ATRAC3 data may be stored in the HDD 201 by control of the CPU 202. In the case of digital input, music identification information such as so called ISRC and TOC_ID other than sound data may be obtained. Additionally, the security block 212 may generate a data key and a content accumulation number (CONNUM) for each data (for each data file (or track)) and has a serial number unique to each host. These values may be also stored in the HDD 201 and/or the external non-volatile memory 203.

To reproduce or obtain the encrypted ATRAC3 data file stored in the HDD 201 by a device other than the personal computer 200, the ATRAC3 data file may be copied or moved to the memory card 40. Moving and copying of the file are different. That is, unlike copying, the file may not remain in the HDD 201 when it is moved.

Since the ATRAC3 data is encrypted by the data key, if the data is copied (such as in an unlawful manner), the corresponding sound may not be obtained or reproduced unless the copied data is decrypted. However, if the data key is stolen, the encryption becomes meaningless. In view of this problem, the data key may be encrypted and the value thereof not provided or exposed outside. For example, when moving the data from the HDD 201 to the memory card 40, the data key may be encrypted by a session key and the encrypted data key transmitted from the HDD to the memory card. The memory card 40 may decrypt the data key by the session key and then encrypt the data by the storage key of the memory card and store the encrypted data key into the memory card. Likewise, when copying or moving data from the memory card 40 to the HDD 201, the data key may be encrypted by the session key and the encrypted data key transmitted. The data key recorded in the HDD 201 may differ from the data key recorded in the memory card 40. Thus, audio data and its data key may exist as a pair in the copying or moving destination.

As previously described, a data key and a content accumulation number (CONNUM) may be generated for each data. A value obtained by combining the data key and the content accumulation number may be used as a data ID which is unique to each data as hereinafter described.

The data key and content accumulation number (CONNUM) may be equivalent to the data key and the content accumulation number (CONNUM) included in the track information area TRKINF shown in FIG. 18.

5. Various Recording Paths to the Memory Card and Identification Information of Data Supply Source Examples of recording paths in which data is recorded to the memory card 40 by the recorder 1 of FIG. 1 or the personal computer 200 of FIG. 21 and the identification information for data supply sources (and supply modes) in each of these examples will now be described with reference to FIGS. 22–24. The identification information is a value recorded in bits 1, 2, and 3 of "CC" in the above mentioned data file attribute header (FIGS. 18 and 20). In each of the examples, recorder 1A and recorder 1B may be equivalent to the recorder 1 of FIG. 1. Further, in FIGS. 22–24, dashed lines denote paths of data and solid lines denote paths of the identification information.

Figure 22:
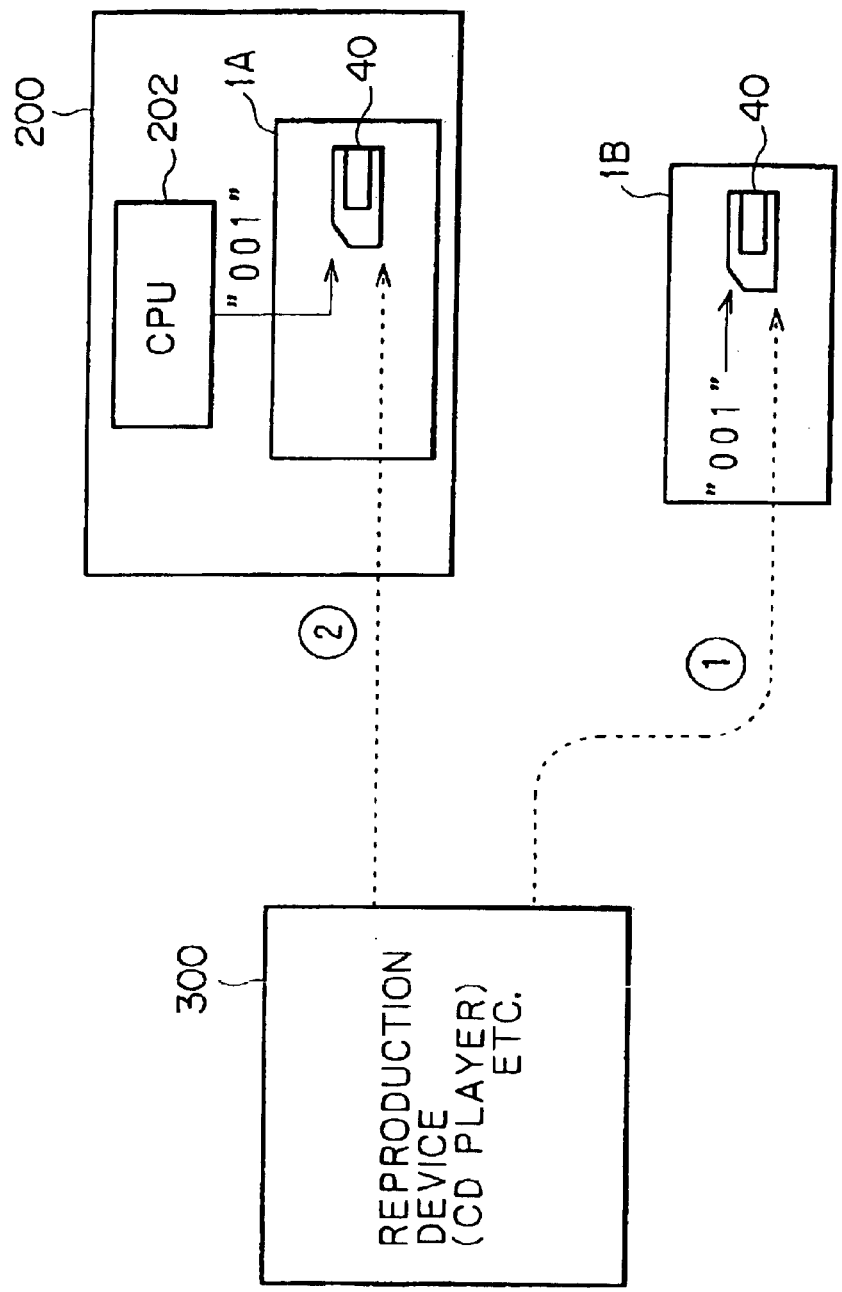
FIG. 22 is a diagram illustrating an example of recording routes to a memory card.

FIG. 22 illustrates data routes for the situation where data (such as music data) is reproduced from a CD by a reproduction apparatus 300 such as a CD player or the like and transmitted therefrom and recorded in the memory card 40.

A route (1) is formed when the recorder 1B (which may be a stand-alone type recorder) is connected to the reproduction apparatus 300. In this arrangement, the reproduction apparatus 300 may be connected to the digital input selector 16 or the line input selector 13 of the recorder 1 (1B) shown in FIG. 1 so as to enable digital audio data or analog audio data to be supplied from the reproduction apparatus to the recorder. The data supplied from the reproduction apparatus 300 may be encoded and encrypted in the recorder 1B as described with reference to FIG. 1 and stored in the memory card 40. As a result, data (such as a piece of music) may be recorded as one data file.

In this example, because the data is reproduced from a CD (which is a reproductiononly recording medium) and inputted to the digital input selector 16 or the line input selector 13, a DSP 30 of the recorder 113 may generate "001" for bits 1, 2, and 3 of "CC", which may be recorded in the attribute header of the data file. As the data is recorded, other control information in the data file and the reproduction management file may also be recorded and/or updated. (This arrangement may also apply to the following examples.) Further, if data is supplied from the reproducing apparatus 300 to the recorder 1 as digital audio data or the recorder 1 is enabled for a control information communication, the DSP 30 of the recorder 1B may obtain TOC information and ISRC information of the CD or the like from which the data has been recorded.

When the reproduction management file is updated, the above-mentioned DISC-TOC, TOC-ID and ISRC may be recorded as additional information.

A route (2) shown in FIG. 22 is formed when the recorder 1A (which may have a configuration as shown in FIG. 1 or FIG. 21) incorporated in the apparatus 200 (which may be a personal computer or an audio/visual apparatus) is connected to the reproduction apparatus 300. The reproduction apparatus 300 may supply digital audio data or analog audio data directly to the recorder 1A. In this case also, the data supplied from the reproduction apparatus 300 may be encoded and encrypted in the recorder 1A and recorded in the memory card 40. Further, the data (such as a piece of music) may be recorded as one data file.

In the above example, CPU 202 which may control the apparatus 200 may generate "001" for bits 1, 2, 3 of "CC" as the identification information of the data supply source and supply the generated values to the recorder 1A. With the use of the supplied "CC" and other information, the recorder 1A may record management information in the data file and record and/or update the reproduction management file. Further, if the TOC information and the ISRC information of a CD or the like on the side of the reproducing apparatus 300 can be obtained, DISC-TOC, TOC-ID, and ISRC may be recorded as additional information when the reproduction management file is updated.

Figure 23:
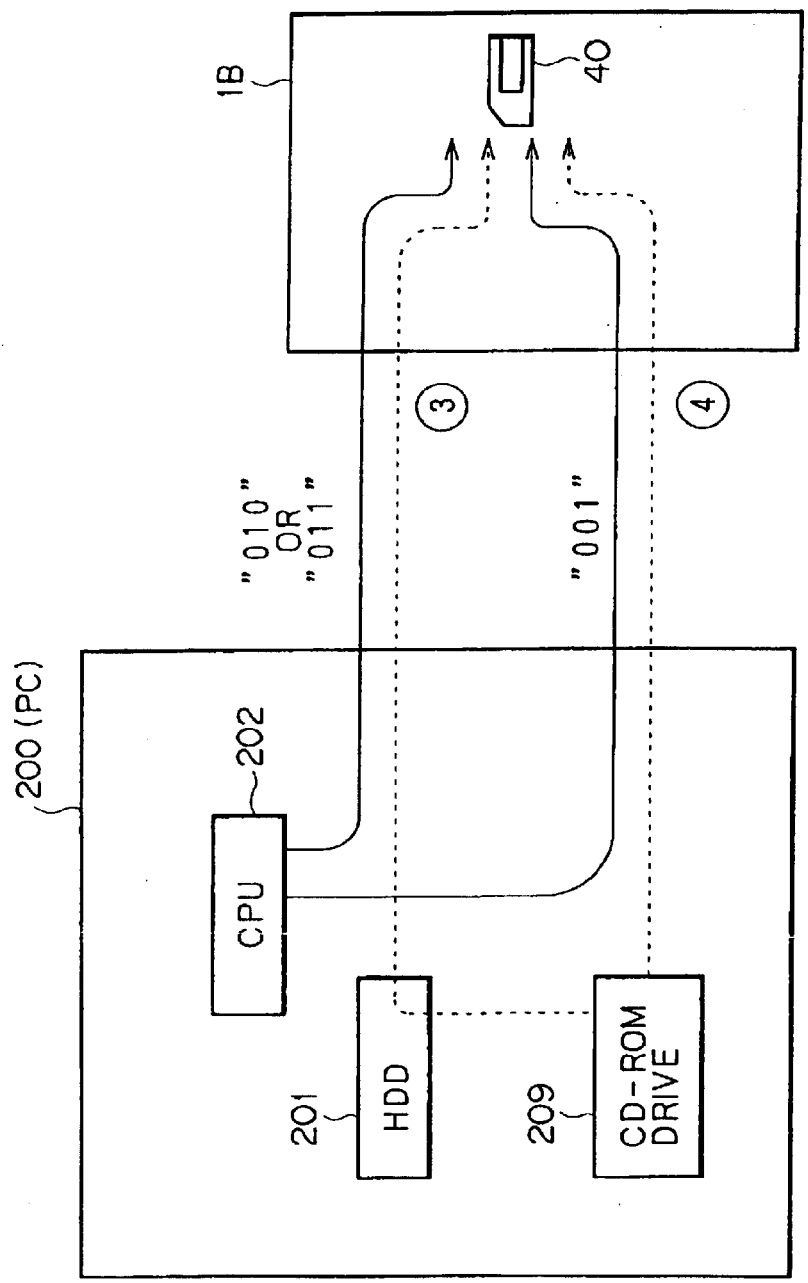
FIG. 23 is a diagram illustrating another example of recording routes to the memory card.

FIG. 23 illustrates data routes for the situation where data (such as music data) reproduced from a CD by CD-ROM drive 209 incorporated in the apparatus 200 (which may be a personal computer) is supplied therefrom and recorded in the memory card 40. In FIG. 23, recorder 1B may have a stand-alone configuration and may be connected to the apparatus 200 by a USB or another communication scheme through terminal 32 shown in FIG. 1.

A route (3) may be formed when data reproduced by the CD-ROM drive 209 is stored in the HDD 201 and then supplied from the HDD to the recorder 1B. The data supplied from the HDD 201 may be copied or moved in the recorder 1B to the memory card 40. Since data is copied or moved from the HDD 201, the CPU 202 of the apparatus 200 which controls the transmission of data may generate "010" or "011" for bits 1, 2, and 3 of "CC" for the recorder 1B and record these values in the attribute header of the data file. Also, the CPU 202 may obtain the TOC information and the ISRC information of a CD from the CD-ROM drive 209, and supply the same to the recorder 1B so that DISC-TOC, TOC-ID, and ISRC may be recorded when the reproduction management file is updated.

A route (4) shown in FIG. 23 may be formed when the data reproduced by the CDROM drive 209 is supplied directly to the recorder 1B and recorded in the memory card 40. Since the data are recorded from a CD, the CPU 202 may generate "001" for bits 1, 2, and 3 of "CC" for the recorder 113 and record these values to the attribute header of the data file. Also, the CPU 202 may obtain the TOC information and the ISRC information of a CD from the CD-ROM drive 209, and supply the same to the recorder 1B so that DISC-TOC, TOC-ID, and ISRC may be recorded when the reproduction management file is updated.

In the above examples, the recorder 1B is stand-alone device. Further, in the configuration shown in FIG. 21, data may be recorded to the memory card 40 along a route similar to the routes (3) and (4).

Figure 24:
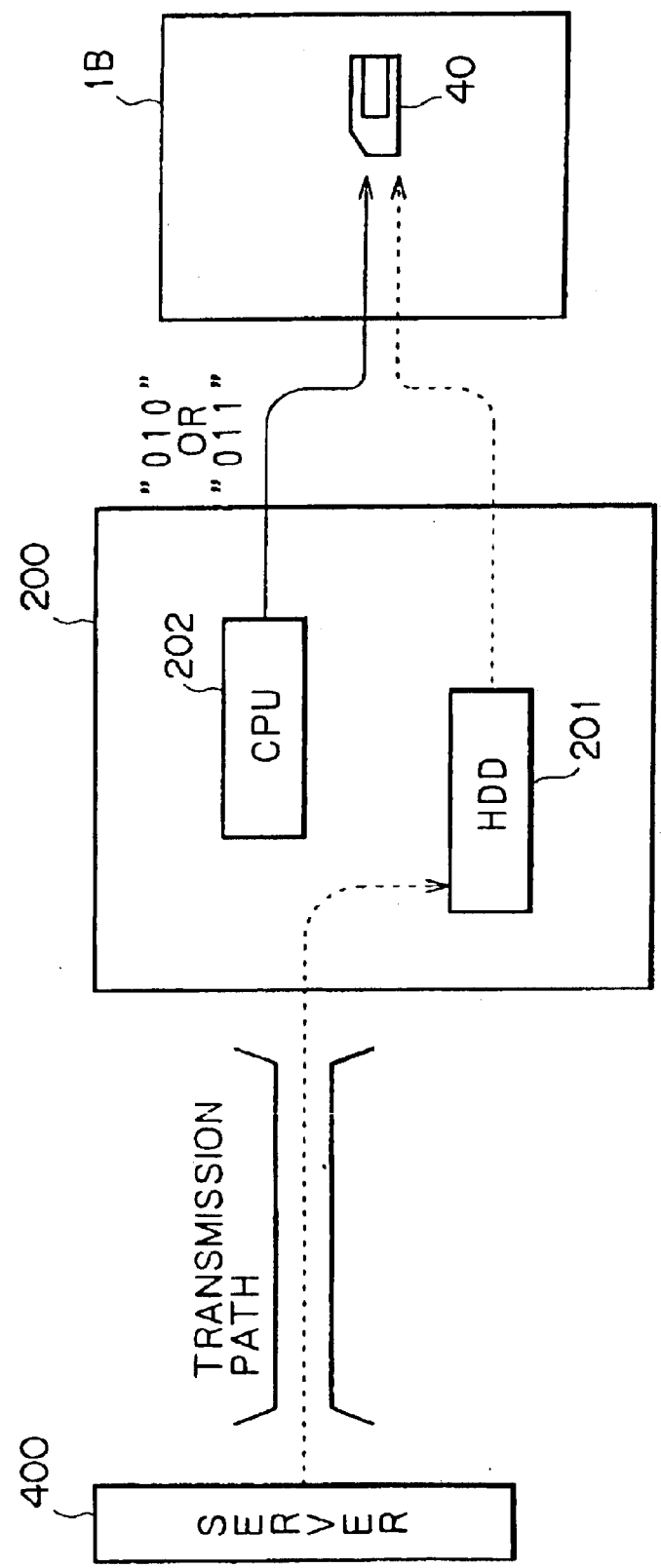
FIG. 24 is a diagram illustrating still another example of recording routes to the memory card.

FIG. 24 illustrates a situation in which the apparatus 200 (which may be a personal computer) downloads data provided by a server 400 into the HDD 201 through a general communication line such as ISDN, a satellite communications line, or any other transmission path and in which the apparatus 200 is connected to the recorder 1B through terminal 32 (FIG. 1) by USB or another communication scheme. The data provided by the server and stored in the HDD 201 may be supplied to the recorder 1B. Such data may be copied or moved in the recorder 1B to the memory card 40. Since the data may be copied or moved from the HDD 20, the CPU 202 may generate "010" or "011" for bits 1, 2, and 3 of "CC" for the recorder 1B and record these values in the attribute header of the data file. As described, values of "100" and higher are undefined. With regard to data captured through a transmission path or the like, it is possible to assign a value "100" or higher. In such a case, CC is "100" or higher.

In the above case, data may be recorded to the memory card 40 along a route similar to that of the configuration shown in FIG. 21.

It should be noted that the recording routes shown in FIGS. 22–24 are merely examples of data recording routes and that many other routes may be utilized. Further, in each example, the values of bits 1, 2, and 3 of "CC" which provide the identification information for the data supply source may be transmitted to the recorder 1 from the apparatus supplying the data or may be generated by the DSP 30 in the recorder. Furthermore, if feasible, the TOC information and the ISRC information of a CD or the like from which data has been recorded may be transmitted to the recorder 1 so as to be recorded as additional information DISC-TOC, TOC-ID, and ISRC.

The above-mentioned examples provide recording routes for audio data such as a data file arranged in the music directory shown in FIG. 6. In addition, when a microphone or the like is connected to or incorporated in the recorder 1, a voice signal captured by the microphone may be recorded as one piece of data. Such data may be a data file arranged in the music directory, this data file having no source of recording.

6. Data Erase Processing

Although in the above situations data included mainly in the music directory has been described, the present invention is not so limited. For example, various pieces of data may be recorded together in the memory card 40 under the control of various directories as shown in FIG. 6. That is, the memory card 40 may have recorded thereon music data, voice data, still picture data, moving picture data, and control data.

Figure 25:
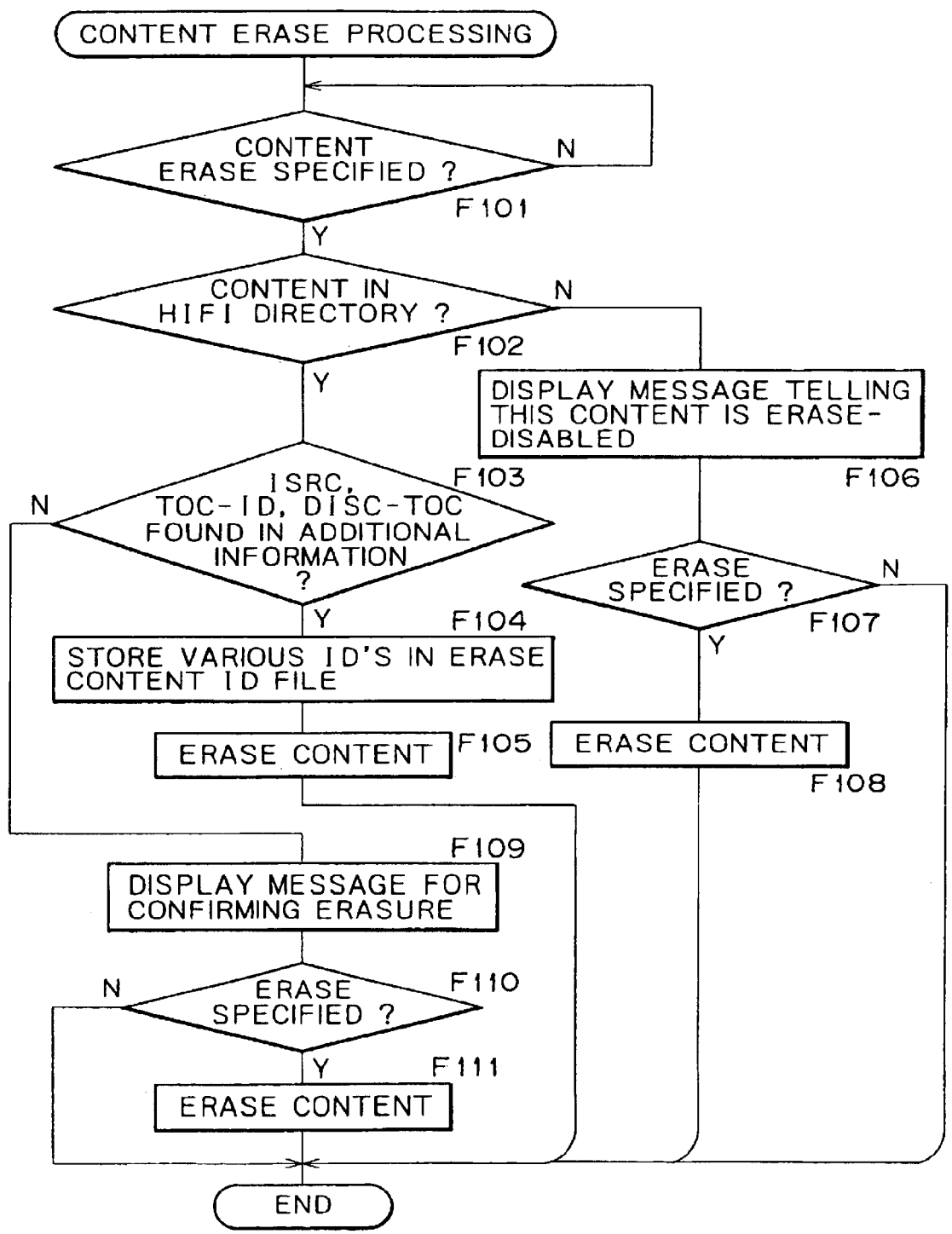
FIG. 25 is a flowchart to which reference will be made in explaining data erase processing.

A description of the processing performed by DSP 30 when a certain piece of data is requested to be erased from the memory card 40 which has various pieces of data stored therein, will now be described with reference to FIG. 25. For this description, it is assumed that a music directory and a voice directory (namely, music data and voice data) are recorded (as two pieces of data together) on the memory card 40. It is further assumed that the DSP 30 handles the data contained in the music directory (such as data copied from a CD or the like) as rerecordable type data, and the data contained in the voice directory (such as data pertaining to a conference, memorandum, or interview) as non-rerecordable type data.

If the storage capacity of the memory card 40 is insufficient when a user starts recording new data to the memory card, the user may erase existing data from the memory card. To do so, and with reference to FIG. 1, the user may operate the operating block 39 so as to specify the data to be erased and cause an erase command to be issued.

When a data erase command is issued, processing performed by the DSP 30 proceeds from step F101 to step F102 whereupon a determination is made as to whether or not the specified data is a data file in the music directory (HIFI). If such determination is affirmative, that is, if the data to be erased is a data file contained in the music directory (HIFI), processing proceeds to step F103 wherein the DSP 30 determines whether or not all or a part of ISRC, TOC-ID, and DISC-TOC which provide a recording source identifier are provided as additional information of that data. If any of them are found, processing may proceed to step F104 wherein the DSP 30 may generate an existing ID (namely, an erase data ID file formed by all or a part of ISRC, TOC-ID, and DISC-TOC) and store the generated file in the memory card 40. Thereafter, processing may proceed to step F 105 wherein the DSP 30 may erase the specified data. Specifically, the DSP 30 may erase the data by updating the reproduction management file in the music directory (HIFI).

The erase data ID file (HIFIEL) may be a file formed in the root directory as shown in FIG. 26 or may be one of the files inside the music directory (HIFI) as shown in FIG. 27. The erase data ID file (HIFIEL) may be generated for each data each time it is erased. Alternatively, every time data erasure occurs, information pertaining to the above-mentioned identifier may be added to an erase data ID file.

Storing information which provides a recording source identifier for each data to be erased can identify the recording source of the erased data at a later time. This enables automatic or manual dubbing of erased data.

Returning to step F103, if none of ISRC, TOC-ID, and DISC-TOC are found as additional information associated with the specified data, there is no recording source identifier and no erase data ID file can be generated. As such, the data erased on the basis of the information of the erase data ID file may not be dubbed again later.

In step F109, the DSP 30 causes a confirmation message to be displayed on the display 33 which may ask the user whether the specified data may be erased irrecoverably. If the user does not want that data to be erased, as indicated by a NO in step F110, the DSP 30 may terminate processing, thereby canceling the erase procedure. On the other hand, if the user does want the data to be erased and specifies the execution of the erase operation (as indicated by a YES in step F110), processing may proceed to step F111 whereupon the specified data is erased. That is, the DSP 30 may update the reproduction management file on the memory card 40.

Returning to step F102, if the specified data is not in the music (HIFI) directory (for example, the specified data is in the voice (VOICE) directory), processing by the DSP 30 may proceed to step F106 whereupon a message may be displayed on the display 33 which informs the user that the specified data is erase disabled in principle. That is, the specified data may not be one dubbed from another recording medium and may be non-rerecordable, and such specified data is considered herein as erase-disabled data.

In step F107, a determination is made as to whether the data is to be erased. If the user does not want to erase the data (as indicated by a NO), the DSP 30 may end the processing and not erase the data. However, if the user wants to erase the data and specifies that the erasing of the data is to be executed even though the message has informed the user that the data is erase-disabled, processing may proceed to step F108 whereupon the DSP 30 may erase the specified data. That is, the DSP 30 may update the reproduction management file in the voice directory (VOICE) on the memory card 40, thereby erasing the data.

Thus, when erasing of rerecordable data in the music directory (HIFI) is specified and the recording source identifier of the specified data is found as additional information, the DSP 30 may retain the identifier and erase the specified data. If the identifier is not found, the DSP 30 may check the intention of the user to determine whether the specified data is to be erased or not. If erasing of non-rerecordable data in the voice directory (VOICE) is specified, the DSP 30 may not erase the data unless the user specifies that such data is to be erased after being informed that the specified data is non-rerecordable.

Thus, data may be erased in differently depending on whether the data is rerecordable or not. Accordingly, erase processing may be performed according to data and/or its characteristics. Furthermore, as previously described, before non-rerecordable data may be erased, a message may provided to a user so as to inform the user that the data is non-rerecordable, thereby warning the user to be careful in erasing such data.

7. All Erase Processing

Figure 28:
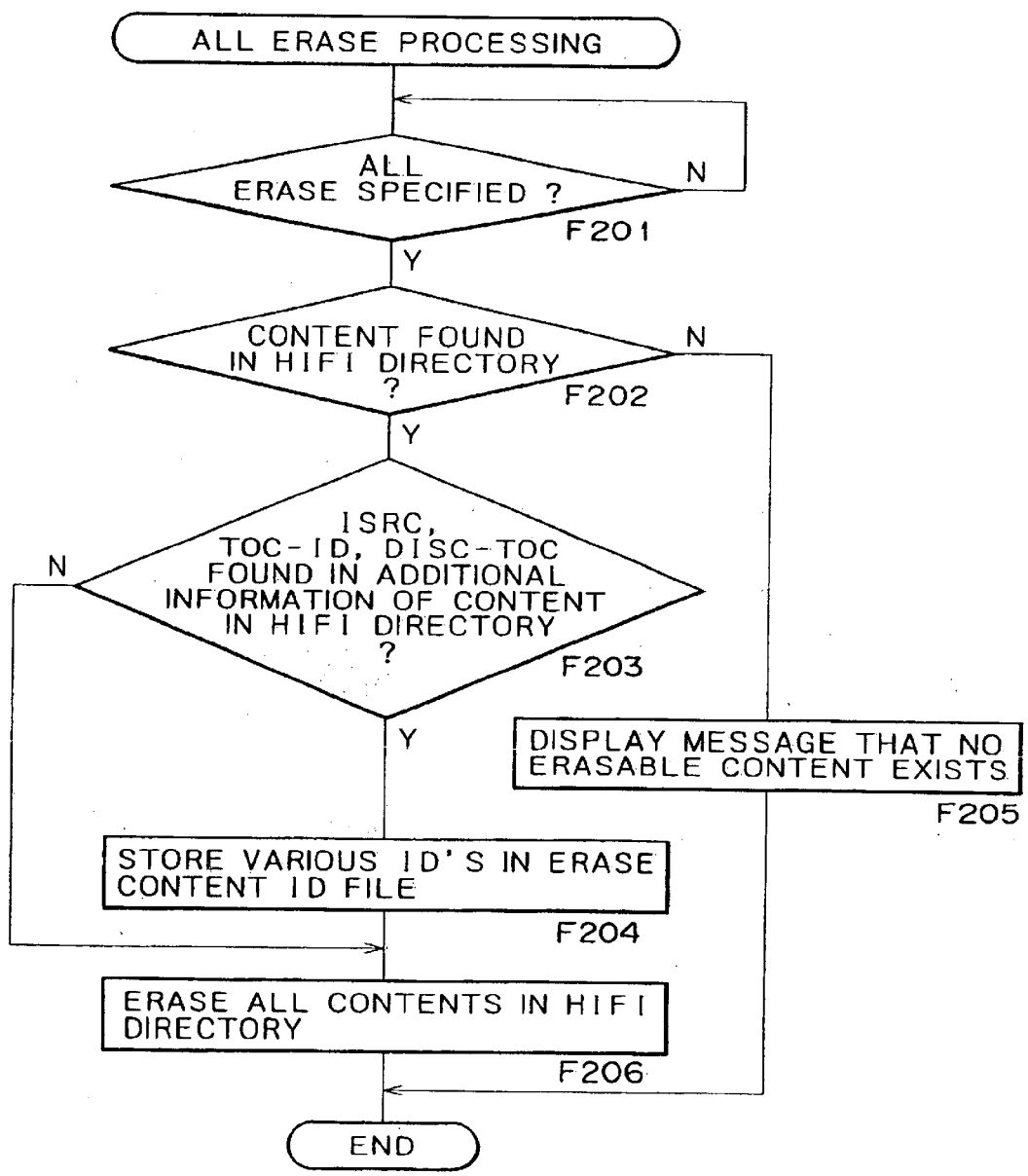
FIG. 28 is a flowchart to which reference will be made in explaining all erase processing.

The user may specify an all erase operation for the memory card 40 having various pieces of data stored therein so as to erase unspecified pieces of data. For example, if the user wants to allocate a relatively large space in the memory card 40 for future recording, the user may execute an all erase operation. The processing associated with such all erase operation will now be described with reference to FIG. 28.

When an all erase operation is specified, processing may proceed from step F201 to step F202 whereupon the DSP 30 may determine if a data file in the music directory (HIFI) exists in the memory card 40. If such determination is affirmative, (that is, if one or more pieces of data as data files in the music directory (HIFI) are found), processing may proceed to step F203 whereupon the DSP 30 may check for any of ISRC, TOC-ID, and DISC-TOC which provide a recording source identifier as additional information of each piece of data in the music directory (HIFI). If any data having any of ISRC, TOC-ID, and DISC-TOC is not found, processing may proceed to step F206. On the other hand, if any data having any of ISRC, TOC-ID, and DISC-TOC is found, processing may proceed to step F204 whereupon the DSP 30 may generate an erase data ID file formed by the existing ID (namely, the data of all or a part of ISRC, TOC-ID, and DISC-TOC) and record the generated file to the memory card 40.

For all pieces of data in the music directory (HIFI), if their recording source identifiers are found as additional information, the DSP 30 may record the erase data ID file so as to record the identifier of each piece of data. However, if one piece of data in the music directory (HIFI) has a recording source identifier, the DSP 30 may record the erase data ID file so as to record the identifier of that data.

After step F204, processing may proceed to step F206 whereupon the DSP 30 may execute the specified data erase operation. Specifically, the DSP 30 may update the reproduction management file in the music directory (HIFI), thereby erasing all pieces of data in the music directory (HIFI).

In this case, the erase data ID file (HIFIEL) may also be managed or arranged as indicated in either of FIGS. 26 or 27. Also, the erase data ID file (HIFIEL) may be generated for each erased data or one erase data ID file may contain information pertaining to the identifiers of erased pieces of data.

Returning to step F202, if the determination is negative (that is, if no data file is found in the music directory (HIFI) recorded on the memory card 40), the recorded data is a data file in another directory such as the voice directory (VOICE). As such, processing may proceed to step F205 wherein the DSP 30 may cause a message to be displayed on the display 33 which informs the user that there is no erasable data and may not execute data erase processing.

Accordingly, in the above-described all erase processing, only the data in the rerecordable music directory (HIFI) is erased and the data in the non-rerecordable voice directory (VOICE) is not erased. Therefore, if the user executes an all erase operation, the non-rerecordable data may not be erased.

Erasing all pieces of rerecordable data may allocate a free, recordable space on the memory card 40 for recording new data. However, sometimes a user may wish to erase all pieces of data from the memory card 40 including nonrerecordable data such as a voice data file. For this purpose, a processing scheme for erasing all pieces of data may be set as format processing.

8. Data Erase Processing for Recording

Figure 29:
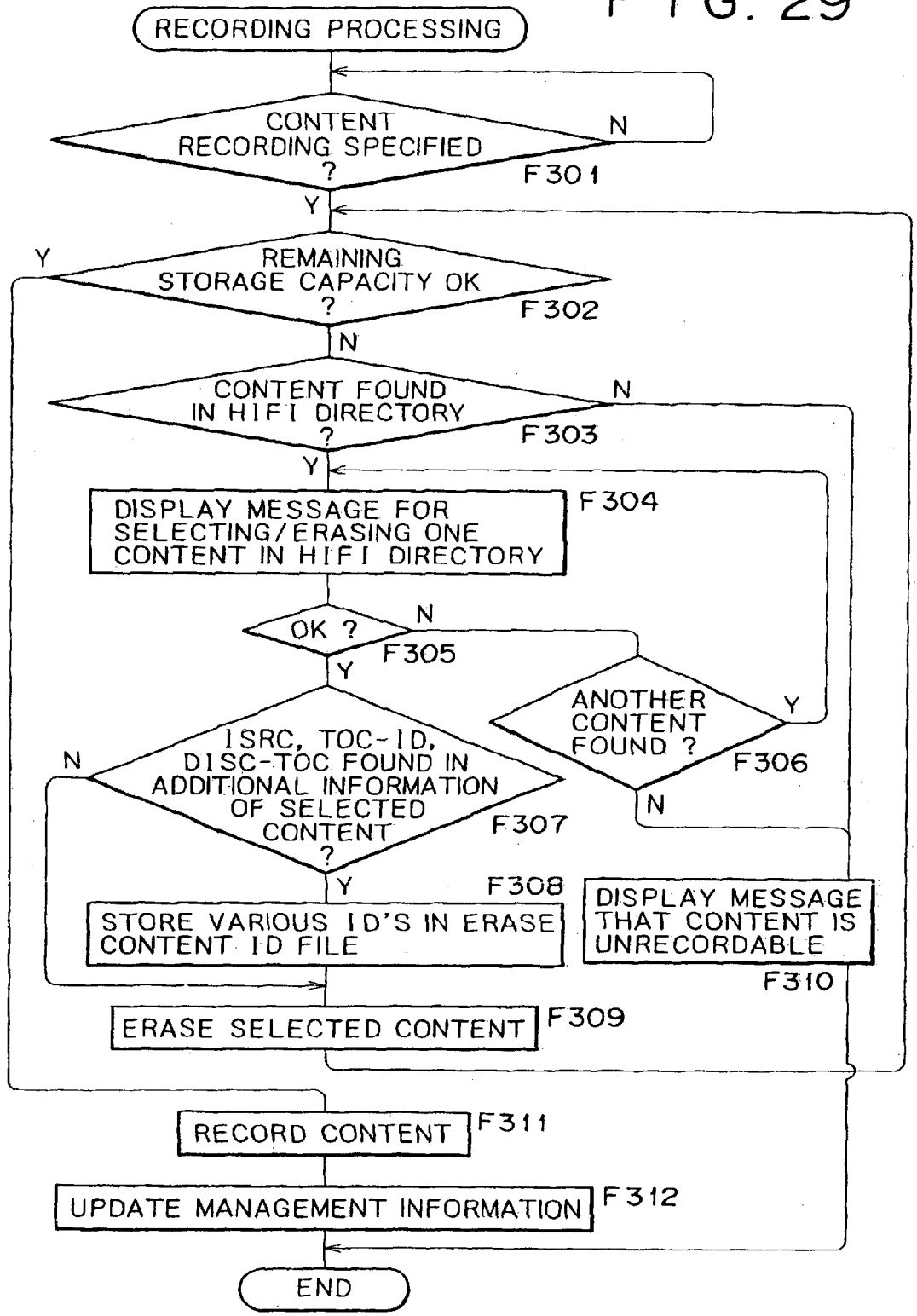
FIG. 29 is a flowchart to which reference will be made in explaining data recording processing.

A description of processing which may be performed when the user records new data to the memory card 40 will now be provided with reference to FIG. 29. Such processing may be preferable when a recorder compliant with the memory card 40 is incorporated in a personal computer having a HDD (Hard Disc Drive). Generally, this processing may be preferable when a section that executes recording control over the memory card 40 grasps, in advance, the size of the data to be recorded. Therefore, the following description may apply to the configuration of FIG. 21 in which data recorded on the HDD 201 may be recorded to the memory card 40 by the CPU 202.

If the user specifies that data recorded on HDD 201 is to be recorded to the memory card 40, processing may proceed from step F301 to step F302 (FIG. 29) whereupon the CPU 202 may determine whether the memory card 40 has sufficient free storage space (i.e., remaining storage space). Specifically, the CPU 202 may check the size of free or available storage space of the memory card 40 and the size of the data recorded on the HDD 201 which is to be recorded to the memory card 40, and compare such sizes. If enough free storage space to record the data is present on the memory card 40, as indicated by a YES at step F302, processing may proceed to step F311 whereupon the CPU 202 may cause the specified data to be recorded. Specifically, the CPU 202 may read the data of the specified data from the HDD 201, perform predetermined processing such as encryption on the data, and write the processed data to the memory card 40. Upon completing the writing of the data to the memory card 40, processing may proceed to step F311 whereupon the CPU 202 may update the management information (the reproduction management file and so on). Thereafter, the processing may be terminated.

However, if the determination of step F302 is NO (that is, if enough free space is not found on the memory card 40), processing may proceed to step F303 whereupon the CPU 202 may check the memory card 40 to determine whether a data file in the music directory (HIFI) exists. If no data file is found in the music directory (HIFI) of the memory card 40, this may indicate that all the recorded contents are data files in another directory or directories such as the voice directory (VOICE). If the result of the determination at step F303 is NO, processing may proceed to step F310 whereupon the CPU 202 may cause a message to be displayed on the display device 205 for the user which indicates that there is no data which may be erased for new space and, therefore, data recording at this time cannot be executed. Thereafter, the CPU 202 may terminate processing. In other words, since sufficient free space in the memory card 40 cannot be obtained, data recording may be stopped at this time.

On the other hand, if a data file is found in the music directory (HIFI) in step F303 (as indicated by a YES thereat), processing may proceed to step F304 whereupon the CPU 202 may begin the processing for free space allocation in the memory card 40. That is, in step F304, the CPU 202 may select one data file in the music directory (HIFI) in the memory card 40 and cause the selected data to be displayed on the display device 205 so as to ask the user whether the selected data can be erased or not. If the user does not want the selected data to be erased (as indicated by a NO at step F305), processing may proceed from step F305 to step F306 whereupon the CPU 202 checks the music directory (HIFI) to determine if another data file exists. If another data file is found (as indicated by a YES at step F306), processing may return to step F304 whereupon the CPU 202 may select another data file from the music directory (HIFI) and provide a display so as to ask the user whether or not to erase the selected data file.

If the user does not permit all data files in the music directory (HIFI) to be erased, the CPU 202 may determine that there is no other data file in step F306 at a certain point in time and processing may proceed to step F310. At step F310, the CPU 202 may cause a message to be displayed on the display device 205 so as to inform the user that there is no data which may be erased for new space and, therefore, data recording at this time cannot be executed. As a result, the CPU 202 may end the processing. In other words, since sufficient free space in the memory card 40 cannot be obtained, data recording may be stopped.

Returning to step F305, if the user permits the data file selected in step F304 from the music directory (HIFI) to be erased (as indicated by a YES thereat), processing may proceed to step F307 whereupon the CPU 202 may determine whether there are all or a part of ISRC, TOC-ID, and DISC-TOC which provide a recording source identifier as additional information of the selected data. If any of these are found (as indicated by a YES), processing may proceed to step F308 whereupon the CPU 202 may generate an erase data ID file formed by the existing ID (namely, all or a part of ISRC, TOC-ID, and DISC-TOC) and record the generated file to the memory card 40. Thereafter, processing may proceed to step F309. On the other hand, if there is no identifier for the selected data (as indicated by a NO at step F307), processing may proceed to step F309 without the CPU 202 performing the processing pertaining to the erase data ID file. Such erase data ID file processing may be executed in a manner similar to that of FIGS. 25 and 28.

In step F309, the CPU 202 may erase the selected data. That is, the CPU 202 may update the reproduction management file in the music directory (HIFI) on the memory card 40 so as to erase the data. Thereafter, processing may return to step F302 whereupon the CPU 202 may compare the size of the current free space of the memory card 40 with the size of the data to be recorded to the memory card 40 and determine whether there is enough free space in the memory card 40 due to the erasure of data. If the current free space in the memory card 40 is determined to be sufficient to record the new data (as indicated by a YES at step F302), processing may proceed to step F311 whereupon the CPU 202 may record the data. On the other hand, if the current free space is determined not to be sufficient (as indicated by a NO at step F302), processing may proceed such that the CPU 202 repeats the abovementioned operations of steps F303 through F310.

Thus, when recording certain data, if the memory card 40 does not have enough free space to record that data, pieces of data may be selected from the rerecordable music directory (HIFI) and the selected pieces of data erased so as to allocate or provide a free space in the memory card which is large enough to enable the new data to be recorded therein. When erasing a certain piece of data from the music directory (HIFI), if the recording source identifier for that data exists as additional information, this identifier may be stored before the data is erased so as to facilitate the rerecording of that data. Further, data in the non-rerecordable voice directory (VOICE) may be protected against erasure, thereby protecting original data that may not be recovered if erased.

The present invention is not limited to the above-described examples. Instead, the present invention may be applied to various other system configurations, recorder configurations, and processing schemes.

In the above examples, the data in the music directory (HIFI) is rerecordable and the data in the voice directory (VOICE) is non-rerecordable. Additionally, other arrangements may be usable. For example, data based on data captured by a video camera or a still camera (namely, the data included in the moving picture directory or the still picture directory) may be handled as nonrerecordable data, and the data included in the control directory may also be handled as non-rerecordable data.

Further, data may be rerecordable or non-rerecordable on a data basis rather than on a directory basis. For example, data for which a recording source medium identifier exists as additional information may be handled as rerecordable, while other data for which no such identifier exists may be handled as non-rerecordable.

Data based on moving picture data or still picture data may be handled as rerecordable data if it has been dubbed from a recording medium such as DVD.

In the above examples, a memory card is used as a recording medium. However, other types of recording medium may also be utilized such as an optical disc, a magneto-optical disc, a magnetic disc, a magnetic tape, and so forth.

As described, the present recording apparatus may determine whether data recorded on a recording medium is rerecordable or non-rerecordable and, when data erasure is requested by the user, may control and/or execute erase processing according to the result of such determination. As such, erase control may be provided according to whether the data to be erased is rerecordable or non-rerecordable. That is, when erasure of a particular piece of data is requested, this data may be erased if it is rerecordable and may not be erased if it is non-rerecordable, thereby preventing non-rerecordable data from being inadvertently erased. However, even in the situation involving erasure of non-rerecordable data, the user may specify the erasure of this data after being notified that this data is non-rerecordable, thereby minimizing the chance of inadvertent erasure.

If erasure of unspecified pieces of data is requested, the rerecordable pieces of data may be erased while non-rerecordable pieces of data may not erased. Consequently, rerecordable data (which can be recorded again as required) may be preferentially erased. This arrangement may be useful in allocating recording space in a recording medium. That is, rerecordable data may be erased when a recording medium does not have enough free space to record new data, thereby facilitating the allocation of free space in the recording medium.

Further, the present recording apparatus may not without user approval erase original data based on data captured by a microphone or a camera (namely, nonrerecordable data). Additionally, with the present recording apparatus, data copied from a CD (namely, rerecordable data) may be preferentially erased, thereby saving the user from having to specify the data to be erased and confirm such operation(s).

In addition, when rerecordable data is erased, the additional information of that data may be left unerased on the recording medium, thereby facilitating the rerecording of that data at a later timing.

Although preferred embodiments of the present invention and modifications thereof have been described in detail herein, it is to be understood that this invention is not limited to these embodiments and modifications, and that other modifications and variations may be effected by one skilled in the art without departing from the spirit and scope of the invention as defined by the appended claims.

What is claimed is:

1. An apparatus for determining erasability of data, said apparatus comprising:

determining means for determining whether data stored in a first storage medium is re-recordable by determining whether the data is already stored in a second storage medium;

comparing means for comparing a remaining storable capacity of said first storage medium with an amount of data stored in said second storage medium which is to be stored in said first storage medium; and control means for controlling an erase process for the stored data in said first storage medium according to the determination made by said determining means and the comparison result of said comparing means.

2. An apparatus according to claim 1, wherein said control means erases said stored data when said determining means determines that said stored data is re-recordable.

3. An apparatus according to claim 1, wherein said control means inhibits erasing of said stored data when said determining means determines that said stored data is not re-recordable.

4. An apparatus according to claim 3, further comprising notification means for providing notification that said stored data is inhibited from said erase process when said determining means determines that said stored data is not re-recordable.

5. An apparatus according to claim 4, further comprising operating means for specifying said stored data to be erased, wherein said control means controls the erase process such that said stored data is erased when erasing of said stored data is specified by said operating means after notification by said notification means that said stored data is inhibited from said erase process.

6. An apparatus according to claim 1, further comprising operating means for specifying the stored data to be erased.

7. An apparatus according to claim 6, wherein said operating means specifies a plurality of said stored data to be erased.

8. An apparatus according to claim 7, wherein said operating means specifies all of said stored data to be erased.

9. An apparatus according to claim 1, wherein said control means controls the erase process such that the restorable data stored in said first storage medium is erased when said remaining storable capacity of said first storage medium is insufficient according to the comparison result.

10. An apparatus according to claim 1, further comprising writing means for writing the data stored in said second storage medium in said first storage medium;

wherein said writing means writes the data stored in said second storage medium in said first storage medium when said remaining storable capacity of said first storage medium is sufficient according to the comparison result.

11. An apparatus according to claim 1, wherein said first storage medium has management information stored therein for managing the data stored in said first storage medium.

12. An apparatus according to claim 1, wherein said first storage medium has additional information pertaining to the source which supplied the re-recordable data stored therein.

13. An apparatus according to claim 12, wherein said first storage medium has stored therein identification information which identifies a storage medium as said source.

14. An apparatus according to claim 13, wherein said additional information includes ISRC.

15. An apparatus according to claim 13, wherein said additional information includes management information of the source storage medium.

16. An apparatus according to claim 12, wherein said control means retains said additional information of said re-recordable data when said re-recordable data stored in said first storage medium is erased.

17. An apparatus according to claim 1, wherein the re-recordable data includes data inputted from a microphone.

18. An apparatus according to claim 1, wherein the re-recordable data includes captured video data.

19. An apparatus according to claim 1, wherein the re-recordable data includes data copied from said second storage medium.

20. An apparatus according to claim 1, wherein said first storage medium is a non-volatile memory.

21. An apparatus according to claim 1, wherein said first storage medium is a disc-shaped recording medium.

22. An apparatus according to claim 1, wherein said second storage medium is a hard disk.

23. A method for determining erasability of data:

determining whether data stored in a storage medium is re-recordable by determining whether the data is already stored in another storage medium;

comparing a remaining storable capacity of said storage medium with an amount of data stored in said another storage medium which is to be stored in said storage medium; and controlling an erase process for the stored data in said storage medium according to determination and comparison results.

* * * * *